United States Patent
Kabeshita et al.

(10) Patent No.: US 6,688,833 B1
(45) Date of Patent: Feb. 10, 2004

(54) PART SUCKING NOZZLE LIFTER

(75) Inventors: Akira Kabeshita, Hirakata (JP); Osamu Okuda, Yamanashi (JP); Naoto Mimura, Yamanashi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/979,274
(22) PCT Filed: May 19, 2000
(86) PCT No.: PCT/JP00/03211
  § 371 (c)(1),
  (2), (4) Date: Nov. 21, 2001
(87) PCT Pub. No.: WO00/71306
  PCT Pub. Date: Nov. 30, 2000

(30) Foreign Application Priority Data

May 21, 1999  (JP) ............................................. 11/141728

(51) Int. Cl.[7] .............................................. B65B 21/02
(52) U.S. Cl. ..................... 414/416.01; 414/737; 294/65
(58) Field of Search ........................ 414/416.01, 752.1, 414/404, 737; 294/65; 901/40

(56) References Cited

U.S. PATENT DOCUMENTS 6,068,317 A  *  5/2000  Park ........................... 294/87.1
6,154,954 A  * 12/2000  Seto et al. ..................... 29/740
6,439,631 B1 *  8/2002  Kress ........................... 294/65

FOREIGN PATENT DOCUMENTS

| GB | 2 207 413 | * | 2/1989 | ............ B25J/15/06 |
|----|-----------|---|--------|------------------------|
| JP | 05-092385 | * | 4/1993 | ............ B25J/15/06 |
| JP | 5-152417  |   | 6/1993 | |
| JP | 8-32288   |   | 2/1996 | |
| JP | 8-330791  |   | 12/1996 | |
| JP | 10-22693  |   | 1/1998 | |

* cited by examiner

Primary Examiner—Eileen D. Lillis
Assistant Examiner—Charles Fox
(74) Attorney, Agent, or Firm—Wenderoth, Lind & Ponack, L.L.P.

(57) ABSTRACT

When a nozzle is selected, a piston rod (46) of a nozzle selecting cylinder (45) positioned at a lower end position unfailingly forms a gap (A) with an upper end of a nozzle elevating shaft (55) so that the piston rod of the cylinder (45) is not brought into contact with the nozzle elevating shaft at the time of nozzle selecting. Only when an elevating member (58) is lowered by a drive by an elevation drive motor (56), the piston rod (46) is brought into contact with the nozzle elevating shaft (55).

20 Claims, 18 Drawing Sheets

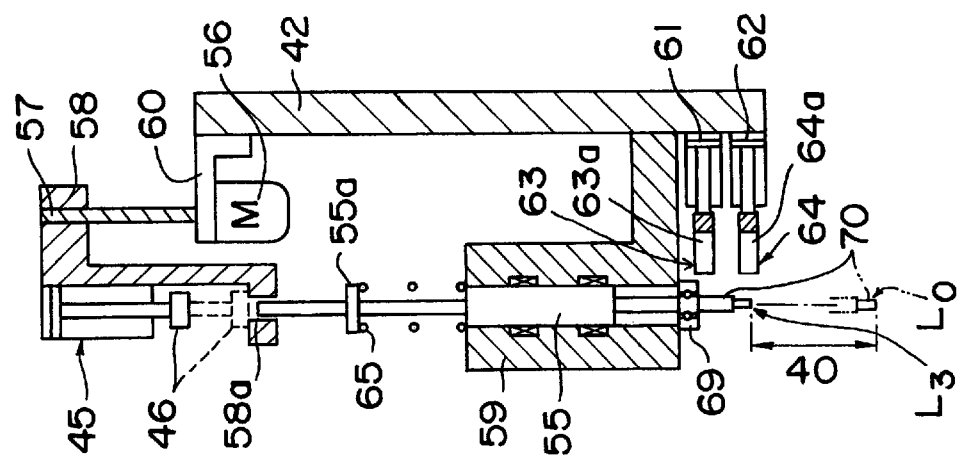
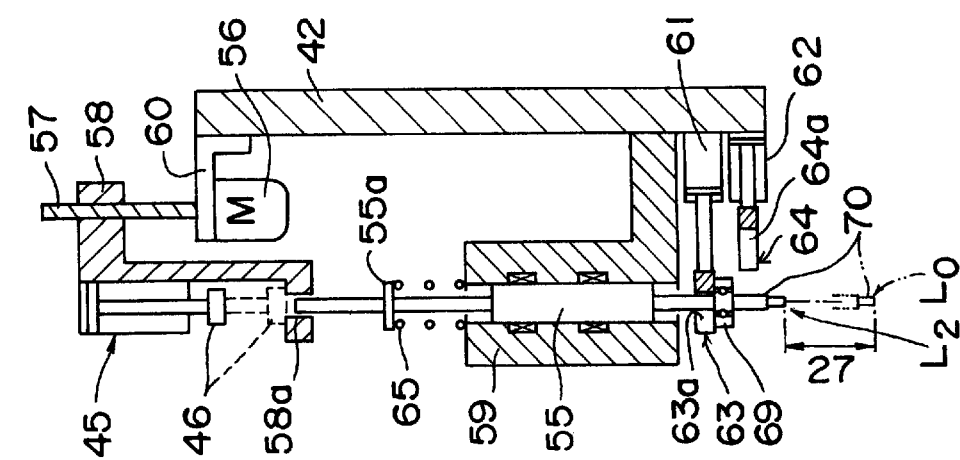
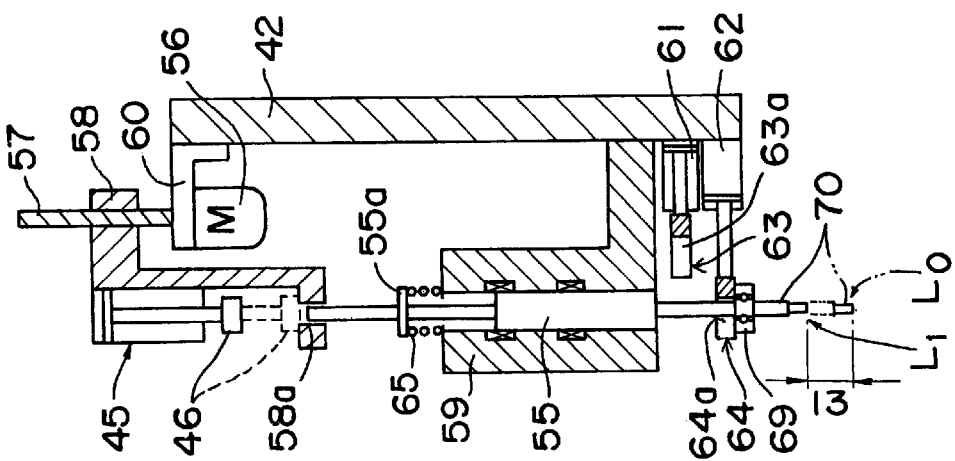

Fig. 6A  Fig. 6B  Fig. 6C  Fig. 6D
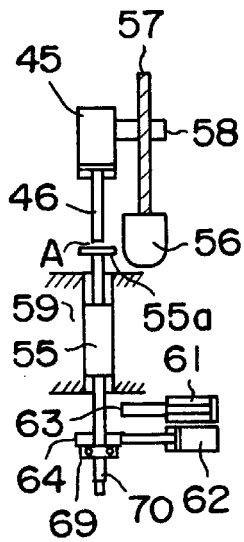 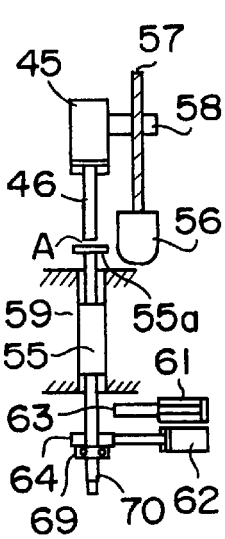 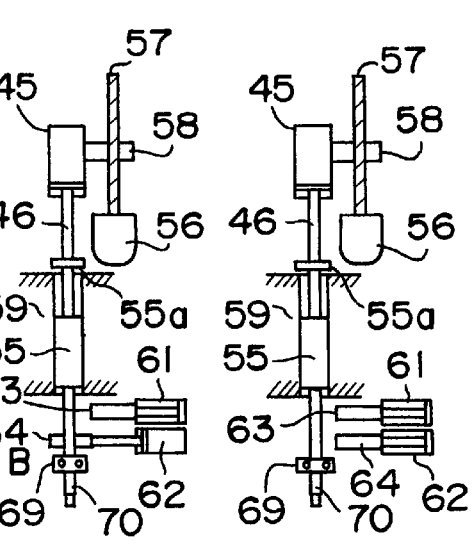
Fig. 6E  Fig. 6F  Fig. 6G
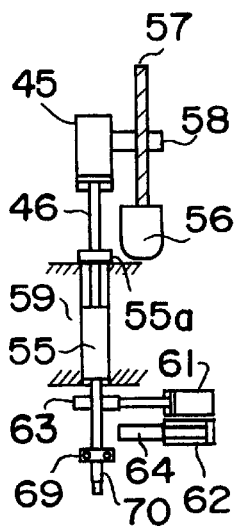 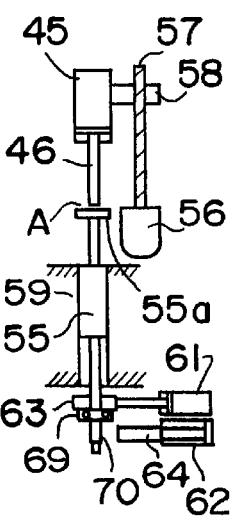 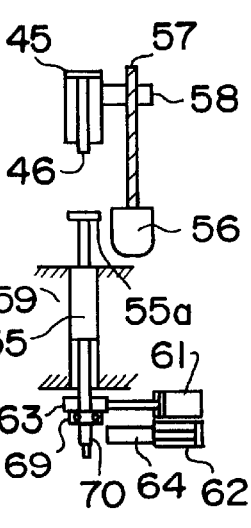

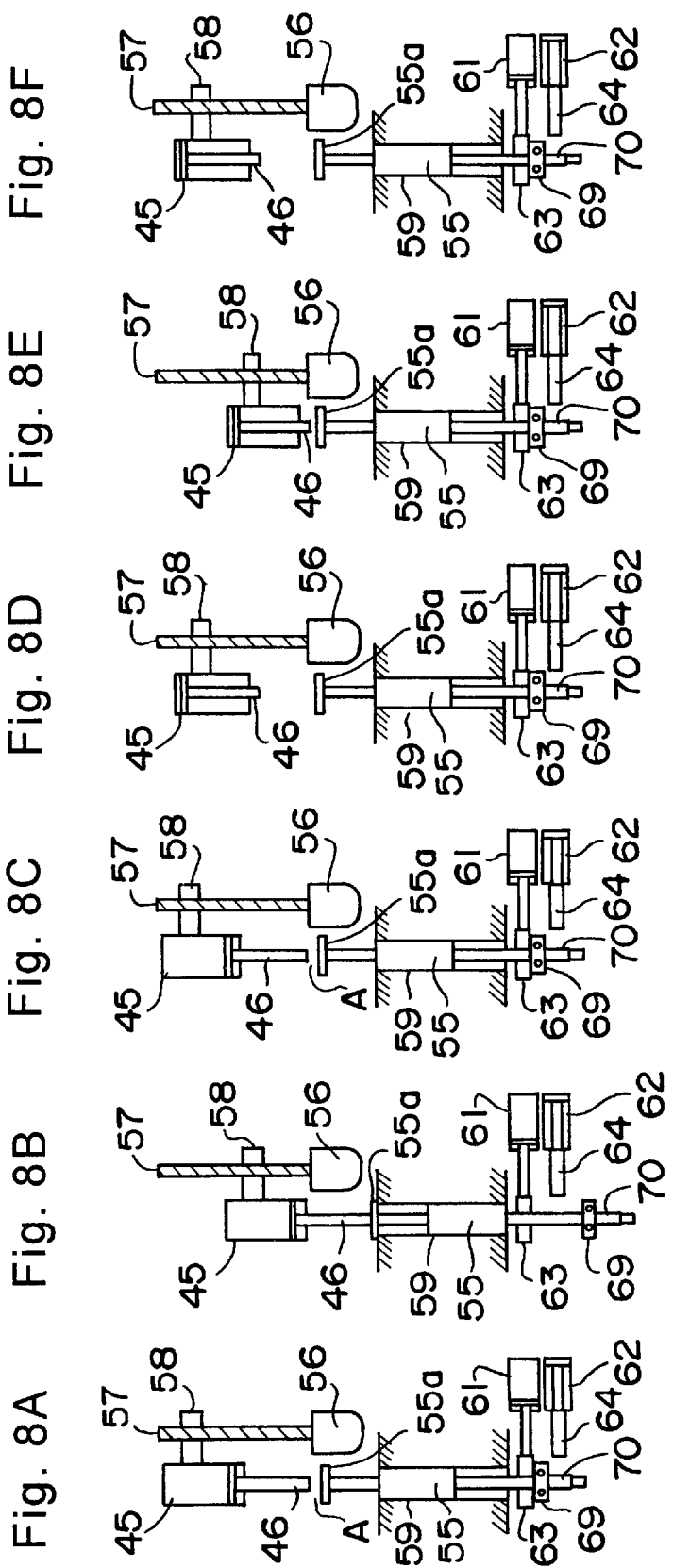

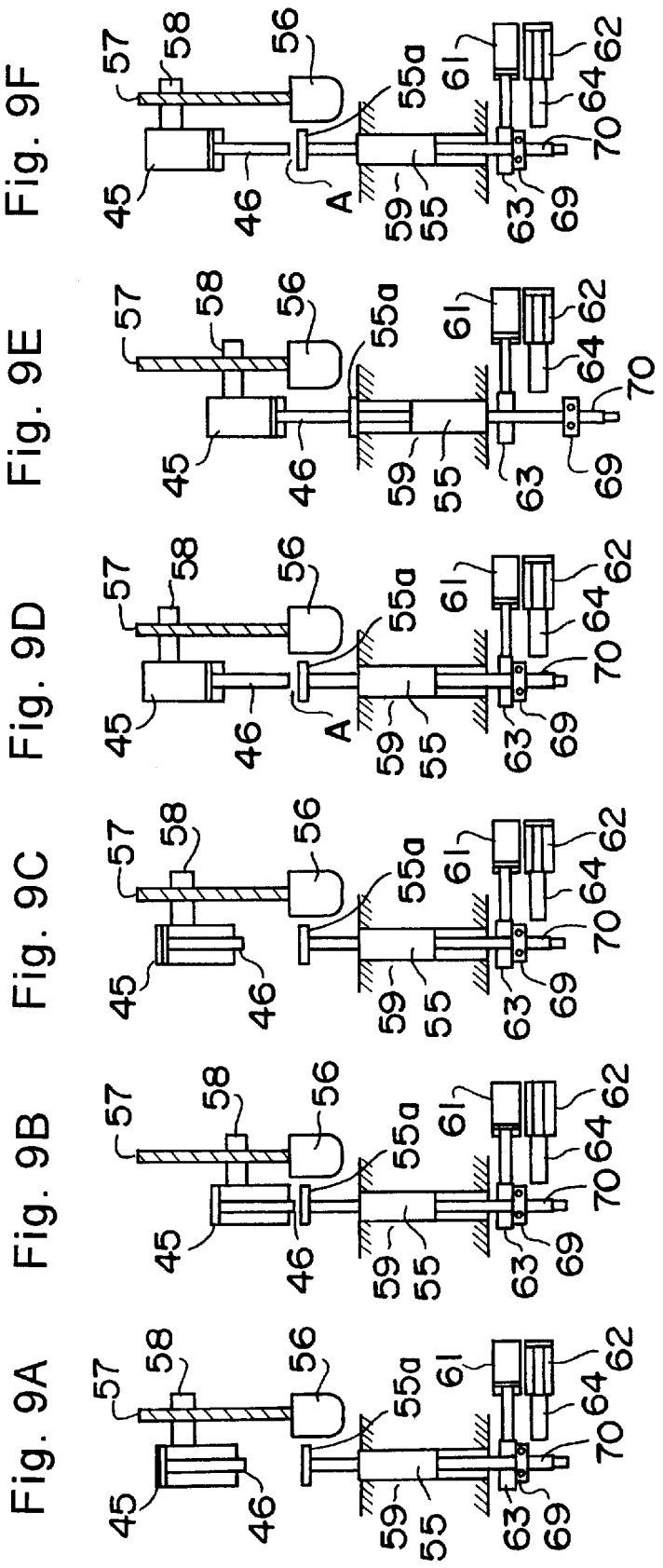

PART SUCKING NOZZLE LIFTER

TECHNICAL FIELD

The present invention relates to a component suction nozzle elevating device which selectively elevates or lowers a suction nozzle for sucking and holding a component and can change a top dead center position of the nozzle when the component is mounted or the like.

BACKGROUND ART

Conventionally, various structures of such a component suction nozzle-elevating device are known. For example, as shown in FIGS. 14 to 17, a ball screw shaft 202 is forwardly and reversely rotated by a rotary drive of a motor 201 so that an elevating plate 203 having a nut screw-threaded to the ball screw shaft 202 is raised or lowered. Flanges 208 are supportedly brought into contact with this elevating plate 203 at which four nozzle elevating shafts 211 penetrate through respective through holes 204. Each nozzle elevating shaft 211 has a nozzle 210 capable of sucking a component at a lower end thereof while provided with an elevation drive air cylinder 205 at an upper end thereof. Since each nozzle elevating shaft 211 is urged downward by a spring 206 in the elevation drive air cylinder 205 at all times, the flange 208 of each nozzle elevating shaft 211 is brought into contact with the elevating plate 203. When the elevating plate 203 is raised or lowered by the rotary drive of the motor 201, each nozzle elevating shaft 211 is guided by a guide unit 209 and raised or lowered.

FIG. 14 shows a state at the original point. When a nozzle is selected, as shown in FIG. 15, the elevating plate 203 is first lowered by a rotary drive of the motor 201 and the flange 208 of each nozzle elevating shaft 211 is separated from the elevating plate 203 by overcoming an urging force of the spring 206. Then, the elevation drive air cylinder 205 of a nozzle elevating shaft 211 having one selected nozzle 210 is driven to lower the nozzle elevating shaft 211 and the flange 208 is brought into contact with the elevating plate 203.

Subsequently, as shown in FIG. 16, while the elevating plate 203 is lowered by the rotary drive of the motor 201, the elevation drive air cylinder 205 of the selected nozzle elevating shaft 211 is driven to lower the nozzle elevating shaft 211. Then, a component is sucked by the nozzle 210 of the lowered nozzle elevating shaft 211 and mounted at a prescribed position on a board.

However, if vertical movement operation driven by the motor 201 and that of the air cylinder 205 are simultaneously started at the time of selecting one nozzle, the nozzle elevating shaft 211 does not immediately start lowering due to compressibility of air or the like even when air is supplied to the air cylinder 205 as compared with lowering operation of the elevating plate 203 by the motor 201. Therefore, as shown in FIG. 16, such a cylinder drive delay may occur that the flange 208 of the nozzle elevating shaft 211 may lower later than the elevating plate 203. Then, the flange 208 of the nozzle elevating shaft 211 catches up with the elevating plate 203 by a drive of the air cylinder 205 and brought into contact therewith. However, an impact due to this contact is transmitted to the nozzle elevating shaft 211 and a component sucked by the nozzle 210 at the lower end of the nozzle elevating shaft 211 can be displaced or dropped Furthermore, as shown in FIG. 17, when all the nozzles are selected and top dead center positions of the nozzle elevating shafts 211 are adjusted by elevating all the nozzle elevating shafts 211, all the nozzle elevating shafts 211 need to be raised via the elevating plate 203 by a motor overcoming activating forces of all the air cylinders in order to raise all the nozzle elevating shafts 211. Therefore, the motor is overloaded.

Accordingly, an object of the present invention is to provide a component suction nozzle elevating device with which no impact is applied to a nozzle elevating shaft so that a component sucked by a nozzle is not displaced or dropped while a process time can be shortened by setting an optimal nozzle elevating stroke, by which the abovedescribed issues can be solved.

DISCLOSURE OF INVENTION

The present invention is constituted as described below to achieve the above object.

According to a first aspect of the present invention, there is provided a component suction nozzle elevating device comprising:

a plurality of nozzle elevating shafts supporting a suction nozzle for sucking and holding components at respective lower ends thereof with the nozzles normally urged upward;

a plurality of nozzle selecting actuators which are disposed corresponding to the plurality of nozzle elevating shafts and, when one suction nozzle to be lowered is selected from the plurality of nozzles, lowers a cylinder corresponding to the selected nozzle elevating shaft having the selected suction nozzle towards the nozzle elevating shaft in a range where the cylinder is not brought into contact with the selected nozzle elevating shaft;

a rotary drive device for elevation which simultaneously lowers all the nozzle selecting actuators to bring the cylinder selectively lowered by the nozzle selecting actuator into contact with the selected nozzle elevating shaft in order to lower the nozzle elevating shaft; and a top dead center changing device which changes a position of a top dead center of each of the nozzle elevating shafts.

According to a second aspect of the present invention, there is provided a component suction nozzle elevating device according to the first aspect, further comprising an elevating member to which all the nozzle selecting actuators are fixed and which is screw-thread to a screw shaft connected to a rotating shaft of the rotary drive device for elevation and raised or lowered by forward and reverse rotation of the screw shaft, wherein the elevating member is raised or lowered by the forward- and reverse rotation of the screw shaft so that all the nozzle selecting actuators are simultaneously raised or lowered.

According to a third aspect of the present invention, there is provided a component suction nozzle elevating device according to the second aspect, wherein the elevating member has a through hole or notch through which an upper end portion of the nozzle elevating shaft can penetrate; when one suction nozzle to be lowered is selected from the plurality of nozzles, the upper end portion of the nozzle elevating shaft is positioned in the through hole or notch in a range in which the upper end portion of the nozzle elevating shaft is not projected above the through hole or notch and a lower end of the cylinder of the nozzle selecting actuator is lowered until brought into contact with an edge of the through hole or notch; a gap is formed between the lower end of the cylinder and the upper end portion of the nozzle elevating shaft in the through hole or notch; and, when the elevating member is lowered by a rotary drive of the rotary drive device for elevation, the lower end of the cylinder and the upper end portion of the nozzle elevating shaft are brought into contact with each other so that the nozzle elevating shaft for elevating is lowered by the lower end of the cylinder.

According to a fourth aspect of the present invention, there is provided a component suction nozzle elevating device according to the second aspect, wherein a flat plate portion with which the lower end of the cylinder is brought into contact and which can be depressed is fixed to the upper end portion of the nozzle elevating shaft; when one suction nozzle to be lower is selected from the plurality of nozzles and the lower end of the cylinder is lowered, a gap is formed between the lower end of the cylinder and the flat plate portion of the upper end portion of the nozzle elevating shaft; and, when the elevating member is lowered by the rotary drive of the rotary drive device for elevation, the lower end of the cylinder and the flat plate portion of the upper end portion of the nozzle elevating shaft are brought into contact with each other and the nozzle elevating shaft is lowered by the lower end of the cylinder.

According to a fifth aspect of the present invention, there is provided a component suction nozzle elevating device according to any one of the first to fourth aspects, wherein the top dead center changing device is constituted by a top dead center changing cylinder having an engaging portion engaged to the nozzle elevating shaft on a piston rod; and the top dead center of the nozzle elevating shaft when the engaging portion of the piston rod is engaged to the nozzle elevating shaft by driving the top dead center changing cylinder is positioned below the top dead center of the nozzle elevating shaft when the engaging portion of the piston rod of the top dead center changing cylinder is unengaged to the nozzle elevating shaft.

According to a sixth aspect of the present invention, there is provided a component suction nozzle elevating device according to any one of the first to fourth aspects, wherein the top dead center changing device is constituted by a first top dead center changing actuator and a second top dead center changing actuator and has engaging portions engaged to the nozzle elevating shafts on the piston rods of the respective top dead center changing actuators; and a top dead center of the nozzle elevating shaft is positioned downward in an order of a top dead center of the nozzle elevating shaft when the engaging portion of the piston rod of the first top dead center changing actuator is unengaged to the nozzle elevating shaft, a top dead center of the nozzle elevating shaft when the engaging portion of the piston rod of the first top dead center changing actuator is engaged to the nozzle elevating shaft, and a top dead center of the nozzle elevating shaft when the engaging portion of the piston rod of the second top dead center changing actuator is engaged to the nozzle elevating shaft.

According to a seventh aspect of the present invention, there is provided a component suction nozzle elevating device according to any one of the first to fifth aspects, wherein the nozzle selecting actuator is a nozzle selecting cylinder; the rotary drive device for elevation is an elevation drive motor; and the screw shaft is a ball screw shaft.

According to an eighth aspect of the present invention, there is provided a component mounting apparatus comprising:

component supply units for housing components sucked by the suction nozzles of the component suction nozzle elevating device;

a head drive device for moving a head having the component suction nozzle elevating device according to any one of the first to seventh aspects; and a board conveying/holding device for holding a board on which components picked up by the suction nozzle of the component suction nozzle elevating device are mounted; the component mounting apparatus, wherein the head is moved to the component supply unit by a drive of the head drive device and one selected suction nozzle is lowered so that a component is picked up by the component suction nozzle elevating device from the component supply unit; the head is moved from the component supply unit to the board by the drive of the head drive device; and the suction nozzle which is selected and picks up the component is lowered by the component suction nozzle elevating device to mount the component onto the board.

BRIEF DESCRIPTION OF DRAWINGS

These and other aspects and features of the present invention will become clear from the following description taken in conjunction with the preferred embodiments thereof with reference to the accompanying drawings, in which:

FIGS. 4A, 4B, and 4C are partially sectional views for explaining states of the component suction nozzle elevating device in FIG. 1 at level 1, level 2, and level 3, respectively;

FIGS. 6A, 6B, 6C, 6D, 6E, 6F, and 6G are partially sectional views for explaining operations of switching the nozzle height of a first nozzle of the component suction nozzle elevating device in FIG. 5;

FIGS. 8A, 8B, 8C, 8D, 8E, and 8F are partially sectional views for explaining nozzle switching operations for the first nozzle of the component suction nozzle elevating device in FIG. 5;

FIGS. 9A, 9B, 9C, 9D, 9E, and 9F are partially sectional views for explaining nozzle switching operations for the second nozzle of the component suction nozzle elevating device in FIG. 5;

BEST MODE FOR CARRYING OUT THE PRESENT INVENTION

Figure 1:
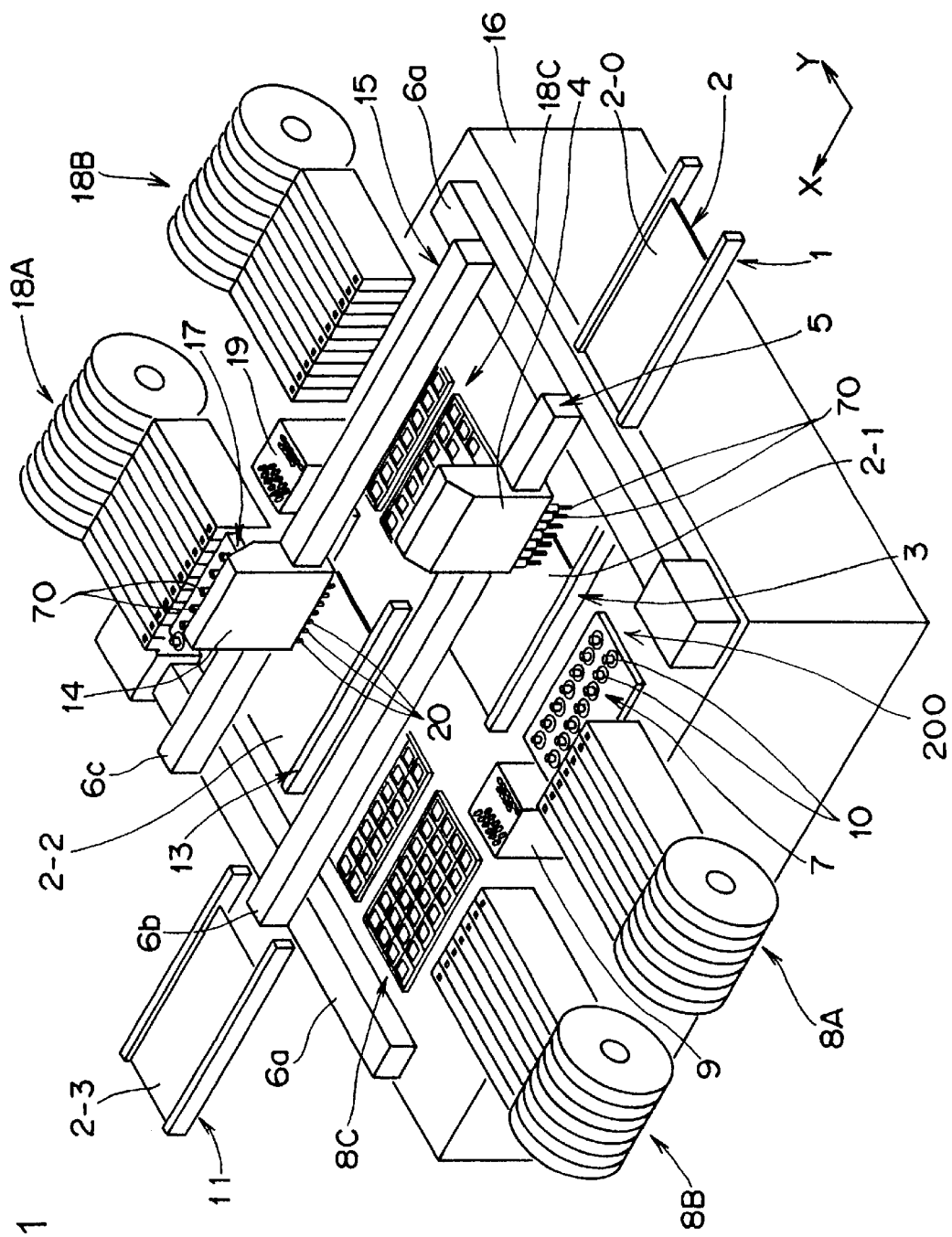
FIG. 1 is a perspective view showing a component mounting apparatus provided with a component suction nozzle elevating device according to an embodiment of the present invention.

Before the description of the present invention proceeds, it is to be noted that like parts are designated by like reference numerals throughout the accompanying drawings.

A first embodiment of the present invention is described in detail with reference to the accompanying drawings.

FIG. 1 is a full schematic perspective view showing a component mounting apparatus provided with a component suction nozzle elevating device 41 according to an embodiment of the present invention.

In FIG. 1, reference numeral 1 denotes a loader for carrying in an electronic circuit board 2-0 as one example of a board (reference numeral 2 is used when a board is referred to irrespective of the position thereof. Reference numerals 2-0, 2-1, 2-2, and 2-3 are used when boards at specific positions are referred to). Reference numeral 11 denotes an unloader for carrying out the electronic circuit board 2-3. Reference numeral 3 denotes a first board conveying/holding device (front side board conveying/holding device) provided with a pair of support rail units for conveying and holding the electronic circuit board 2-1 carried in from the loader 1. Reference numeral 4 denotes an operating head having a plurality of, for example, ten component suction nozzles 70 replaceably attached thereto for sucking electronic components. Reference numeral 5 denotes an X-Y robot for positioning the operating head 4 at a prescribed position in X-Y directions, which are two directions perpendicular to each other in a component mounting work area. Reference numerals 7 denotes a nozzle station which is positioned in the vicinity of a component supply unit 8A in the component mounting work area and houses a plurality of kinds of nozzles 70 suitable for a plurality of kinds of electronic components to replace nozzles 70 attached to the operating head 4 therewith as required. Reference numerals 8A, 8B denote component supply units which are positioned at an end portion on the near side of an operator in the component mounting work area, that is, the front side in relation to the operator and houses taping components formed by holding and housing components to be mounted on the board 2-1 on tapes. Reference numeral 8C denotes a component supply unit which is positioned in the vicinity of the component supply unit 8B and houses tray components formed by holding and housing components to be mounted on the board 2-1 on trays. Reference numeral 9 denotes a recognition camera which is positioned on the side closer to the center of the component mounting work area in the vicinity of the component supply unit 8A and picks up an image of a suction attitude of an electronic component sucked by the nozzle 70 of the operating head 4.

Meanwhile, reference numerals 13 denotes a second board conveying/holding device (rear side board conveying/holding device) provided with a pair of support rail units for conveying and holding the electronic circuit board 2-1 carried in from the first board conveying/holding device 3. Reference numeral 14 denotes an operating head having a plurality of, for example, ten component suction nozzles 70 replaceably attached thereto for sucking and holding electronic components. Reference numeral 15 denotes an X-Y robot for positioning the operating head 14 at a prescribed position in the X-Y directions, which are two directions perpendicular to each other in a component mounting work area. Reference numerals 17 denotes a nozzle station which is positioned in the vicinity of a component supply unit 18A in the component mounting work area and houses a plurality of kinds of nozzles 70 suitable for a plurality of kinds of electronic components to replace nozzles 70 attached to the operating head 14 therewith as required. Reference numerals 18A, 18B denote component supply units which are positioned at an end portion on the far side of the operator in the component mounting work area, that is, the rear side in relation to the operator and houses taping components formed by holding and housing components to be mounted on the board 2-2 on tapes. Reference numeral 18C denotes a component supply unit which is positioned in the vicinity of the component supply unit 18B and houses tray components formed by holding and housing components to be mounted on the board 2 on trays. Reference numeral 19 denotes a recognition camera which is positioned on the side closer to the center of the component mounting work area in the vicinity of the component supply unit 18A and picks up an image of a suction attitude of an electronic component sucked up by the nozzle 70 of the operating head 14.

The aforementioned X-Y robot 5, 15 is constituted as described below. Two Y-axis drive units 6a, 6a of an X-Y robot device 6 are fixedly disposed at front and rear end edges in a board conveying direction in the component mounting work area 200 on a mounting apparatus base 16. Two X-axis drive units 6b, 6c are disposed across these two Y-axis drive units 6a, 6a so as to be able to move independently in the Y-axis direction and avoid collision. Furthermore, the X-axis drive unit 6b has an operating head 4 which is disposed movably in the X-axis direction and moves in the mounting region on the near side half in the component mounting work area while the X-axis drive unit 6c has an operating head 14 which is disposed movably in the X-axis direction and moves in the mounting region on the far side half in the component mounting work area. Thus, the aforementioned X-Y robot 5 is constituted by the two Y-axis drive units 6a, 6a fixed on the mounting apparatus base 16, the X-axis drive unit 6b movable in the Y-axis direction on the Y-axis drive unit 6a, 6a, and the operating head 4 movable in the X-axis direction on the X-axis drive unit 6b. Furthermore, the X-Y robot 15 is constituted by the two Y-axis drive units 6a, 6a fixed on the mounting apparatus base 16, the X-axis drive unit 6c movable in the Y-axis direction on the Y-axis drive unit 6a, 6a, and an operating head 14 movable in the X-axis direction on the X-axis drive unit 6c. Thus, the operating head 4, 14 can move independently in the X-Y directions.

Figure 2:
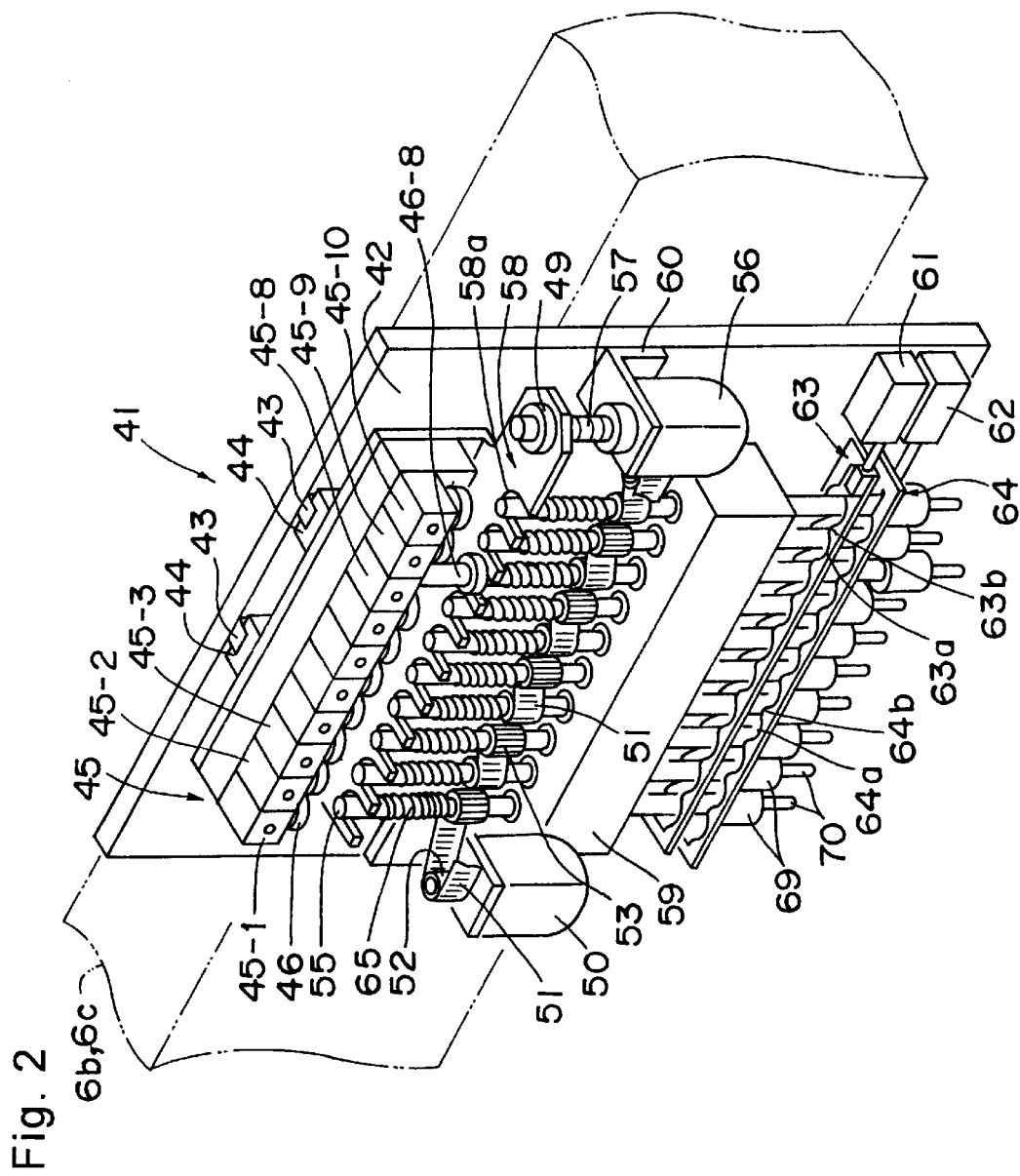
FIG. 2 is a perspective view showing the component suction nozzle elevating device in FIG. 1.
Figure 3:
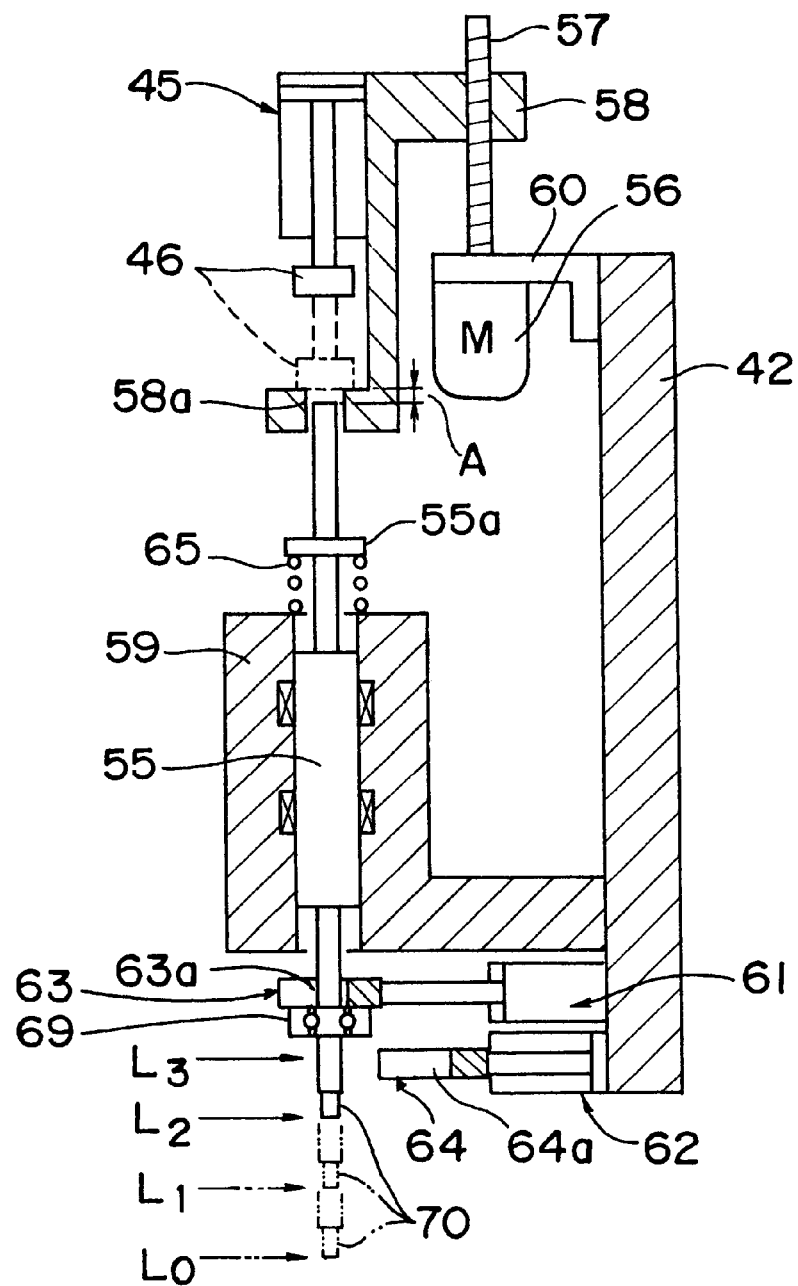
FIG. 3 is a partially sectional view for explaining the component suction nozzle elevating device in FIG. 1.

FIGS. 2 and 3 are perspective views showing a component suction nozzle elevating device 41 disposed in the operating head 4, 14. Each component suction nozzle elevating device 41 is generally constituted by a plurality of, for example, ten nozzle elevating shafts 55, the same number of nozzle selecting cylinders 45 (for example, air cylinders, electromagnetic solenoids or the like) as the nozzle elevating shafts 55 as an example of a nozzle selecting actuator, an elevation drive motor 56 as an example of a rotary drive device for elevation, at least one top dead center changing actuator as an example of a top dead center changing device and first and second top dead center changing cylinders 61, 62 (for example, air cylinders) for switching the top dead centers are used as an example of a case where two top dead center changing actuators are used in this embodiment.

The plurality of nozzle elevating shafts 55 support a suction nozzle 70 for sucking and holding a component at a lower end of each nozzle elevating shaft 55 via a rotary joint 69. Normally, a spring 65 is brought into contact with a flat plate portion 55a provided to the nozzle elevating shaft 55 and urges the flat plate portion 55a upward. Elevating operation of each nozzle elevating shaft 55 in the up-and-down direction is guided by a guide member 59 fixed to a support plate 42 of the operating head 4, 14. An upper end position of each nozzle elevating shaft 55 is not specifically shown, but each nozzle elevating shaft 55 is engaged by an engaging protrusion provided to the guide member 59 or the like, and then is controlled so as not to project upward above a prescribed upper end position.

The nozzle selecting cylinders 45 (when the nozzle selecting cylinders are referred to irrespective of the positions thereof, reference numeral 45 is used. First to tenth nozzle selecting cylinders are designated by reference numerals 45-1, 45-2, 45-3, 45-4, 45-5, 45-6, 45-7, 45-8, 45-9, 45-10, respectively.) are fixed to an elevating member 58 which moves up and down in relation to the support plate 42 of the operating head 4, 14 so as to correspond to the plurality of nozzle elevating shafts 55. When one suction nozzle 70 to be lowered is selected from the plurality of nozzles 70, the piston rod 46 of the nozzle selecting cylinder 45 corresponding to the selected nozzle elevating shaft 55 having the selected suction nozzle 70 is lowered towards the upper end portion of the nozzle elevating shaft 55 in a range in which the piston rod 46 is not brought into contact with the selected nozzle elevating shaft 55. For example, FIG. 2 shows a state that the piston rod 46-8 of the nozzle selecting cylinder 45-8 corresponding to the eighth nozzle 70 is lowered to the lower end position. Each piston rod 46 has a circular plate fixed at the lower end thereof so as to have an inverted T-shaped side surface, so that the nozzle elevating shaft 55 is easily depressed by the rod 46 as described later.

The elevating member 58 is elevatably supported by the support plate 42 of the operating head 4, 14. That is, the support plate 42 is provided with two parallel linear guide members 43, 43. Two sliders 44, upper and lower, each provided on the rear surface of the elevating member 58 elevate or lower along respective linear guide members 43 so that elevating operation of the elevating member 58 is guided. Furthermore, the elevating member 58 has through holes or notches 58a (shown as notches in FIG. 2) through which an upper end portion of each of the nozzle elevating shafts 55 can penetrate. When one suction nozzle 70 to be lowered is selected from the plurality of nozzles 70, the upper end portion of the nozzle elevating shaft 55 is positioned in the notch 58a in a range in which the upper end portion is not projected upward above the notch 58a and the lower end of the piston rod 46 of the nozzle selecting cylinder 45 is lowered until brought into contact with the elevating member 58 at an edge of the notch 58a. Then, a gap A is formed between the lower end of the piston rod 46 and the upper end portion of the nozzle elevating shaft 55 in the notch 58a. When the elevating member 58 is lowered by a rotary drive of the elevation drive motor 56, the upper end portion of the nozzle elevating shaft 55 is projected from the notch 58a and thereby the lower end of the piston rod 46 and the upper end portion of the nozzle elevating shaft 55 are brought into contact and then the nozzle elevating shaft 55 is lowered by the lower end of the piston rod 46.

The elevation drive motor 56 is fixed to the support plate 42 of the operating head 4, 14 by a bracket 60. A ball screw shaft 57 as an example of a screw shaft is connected to a rotating shaft of the elevation drive motor 56. The ball screw shaft 57 is screw-thread with a nut 49 of the elevating member 58. Therefore, the elevating member 58 is raised or lowered by forward and reverse rotation of the ball screw shaft 57 so that all the nozzle selecting cylinders 45 are integrally raised or lowered at the same time. Thus, when all the nozzle selecting cylinders 45 are integrally lowered at the same time, the piston rod 46 selectively lowered from the nozzle selecting cylinders 45 is also lowered so that the piston rod 46 is brought into contact with the selected nozzle elevating shaft 55 and then the nozzle elevating shaft 55 is lowered.

The first top dead center changing cylinder 62 and the second top dead center changing cylinder 61, which change a top dead center position of each of the nozzle elevating shafts 55, have engaging portions 64, 63 engaged to an upper end portion of the rotary joint 69 of the nozzle elevating shaft 55 at an end of the piston rod of each top dead center changing cylinder 62, 61. The first top dead center changing cylinder 62 is fixed to the support plate 42 of the operating head 4, 14 so as to be positioned below the second top dead center changing cylinder 61.

Figure 18A:
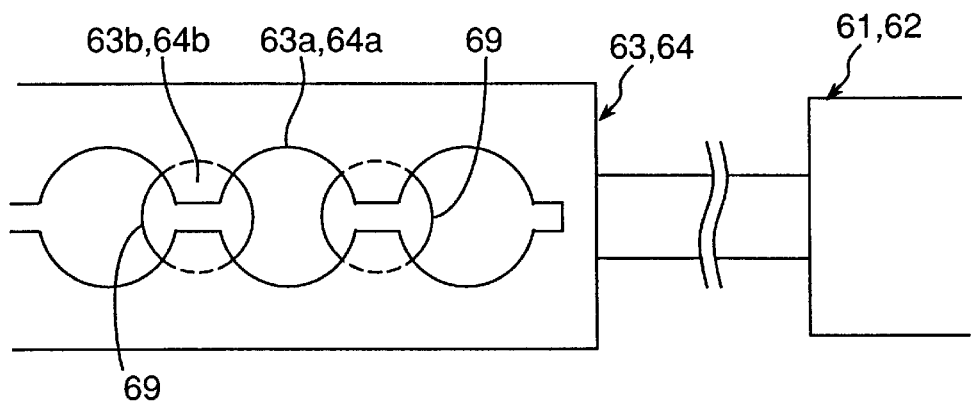
FIGS. 18A and 18B are explanatory views for explaining engaging operation of an engaging portion of a piston rod of a first or second top dead center changing cylinder and a rotary joint of the lower portion of the nozzle elevating shaft and disengaging operation.
Figure 18B:
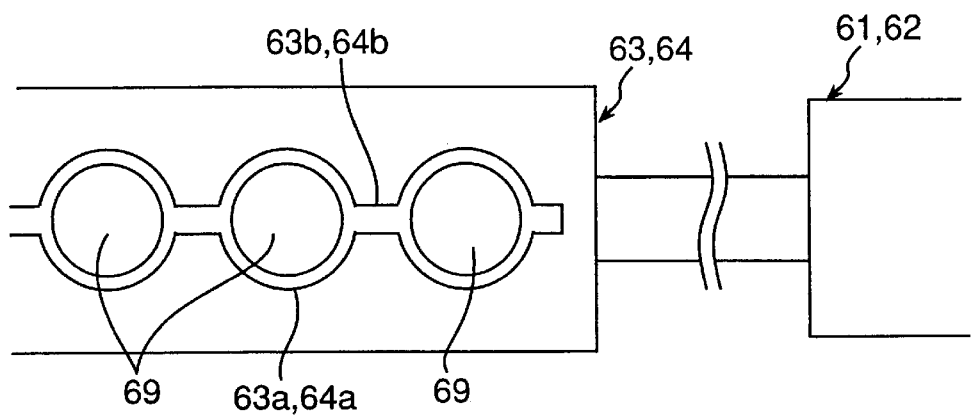

The engaging portion 64 of the piston rod of the first top dead center changing cylinder 62 is constituted by a plate body having unengaging through holes 64a each having an inner diameter dimension larger than an outer diameter dimension of the rotary joint 69 of the lower portion of each nozzle elevating shaft 55 so that the rotary joint 69 penetrates through the unengaging through holes 64a for being unengaged and engaging through holes 64b each having an inner diameter dimension smaller than the outer diameter dimension of the rotary joint 69 so that the rotary joint 69 is engaged with the engaging through holes 64b, with the unengaging through holes 64a and the engaging through holes 64b are alternately formed (see FIGS. 18A and 18B). Therefore, by moving the piston rod 62a of the first top dead center changing cylinder 62 in the lateral direction, the unengaging through holes 64a unengaging the rotary joints 69 of the lower portions of all the nozzle elevating shafts 55 and the engaging through holes 64b engaging these are selectively positioned so that disengaging or engaging operation of all the nozzle elevating shafts 55 can be simultaneously carried out (see FIG. 18A and 18B).

The engaging portion 63 of the piston rod 61a of the second top dead center changing cylinder 61 is constituted by a plate body obtained unengaging through holes 63a each having an inner diameter dimension larger than an outer diameter dimension of the rotary joint 69 of the lower portion of each nozzle elevating shaft 55 so that the rotary joint 69 penetrates through unengaging through holes 63a for being unengaged and engaging through holes 63b each having an inner diameter dimension smaller than the outer diameter dimension of the rotary joint 69 so that the rotary joint 69 is engaged with engaging through holes 63b, with the unengaging through holes 63a and the engaging through holes 63b are alternately formed (see FIGS. 18A and 18B).

Therefore, by moving the piston rod of the second top dead center changing cylinder 61 in the lateral direction, the unengaging through holes 63a unengaging the rotary joints 69 of the lower portions of all the nozzle elevating shafts 55 and the engaging through holes 63b engaging these are selectively positioned so that disengaging or engaging operation of all the nozzle elevating shafts 55 can be simultaneously carried out (see FIG. 18A and 18B).

To clearly understand the engaging and disengaging operations, FIG. 3 and FIGS. 4A to 4C show that the engaging portions 64, 63 are not through holes, but notch holes. At the time of engagement, the engaging portion 64, 63 is brought into contact with the upper end of the rotary joint 69 of the nozzle elevating shaft 55 to regulate the top dead center while, at the time of unengagement, the engaging portion 64, 63 is removed from the nozzle elevating shafts 55 so as to be contrasted. However, the idea about the engaging and disengaging operations is exactly the same as that of the above unengaging through holes 63a and engaging through holes 63b.

FIGS. 4A, 4B, and 4C are partially sectional views for explaining, respectively, states that the nozzle 70 of the component suction nozzle elevating device in FIG. 1 is at a lowest end position L1 (hereinafter, may be referred to as "level 1"), which is, for example, 13 mm above a mounting position L0 (which is also both a suction position and a component recognition position), at an intermediate position L2 (hereinafter, may be referred to as "level 2"), which is, for example, 27 mm above the mounting position L0, and at a highest end position L3 (hereinafter, may be referred to as "level 3"), which is, for example, 40 mm above the mounting position L0. That is, at level 1, the rotary joint 69 of the lower portion of the nozzle elevating shaft 55 is engaged to the engaging portion 64 of the first top dead center changing cylinder 62 and the second top dead center changing cylinder 61 is positioned at a retreat position and thus unengaged. At level 2, the rotary joint 69 of the lower portion of the nozzle elevating shaft 55 is engaged to the engaging portion 63 of the second top dead center changing cylinder 61 and the first top dead center changing cylinder 62 is positioned at the retreat position and thus unengaged. At level 3, the rotary joint 69 of the lower portion of the nozzle elevating shaft 55 is not engaged to the engaging portions 64, 63 of the first and second top dead center changing cylinders 62, 61 but engaged to the guide member 59 while the first top dead center changing cylinder 62 and the second top dead center changing cylinder 61 are positioned at the retreat positions and thus unengaged. In any case, in response to a change in the height of the nozzle elevating shaft 55, the rotating shaft of the elevation drive motor 56 is rotated for a prescribed number of revolutions and the position of the elevating member 58 is also changed. At any level, a gap (dimension A: for example, about 0.02 mm) is formed between the lower end of the piston rod 46 and the upper end portion of the nozzle elevating shaft 55.

Figure 5:
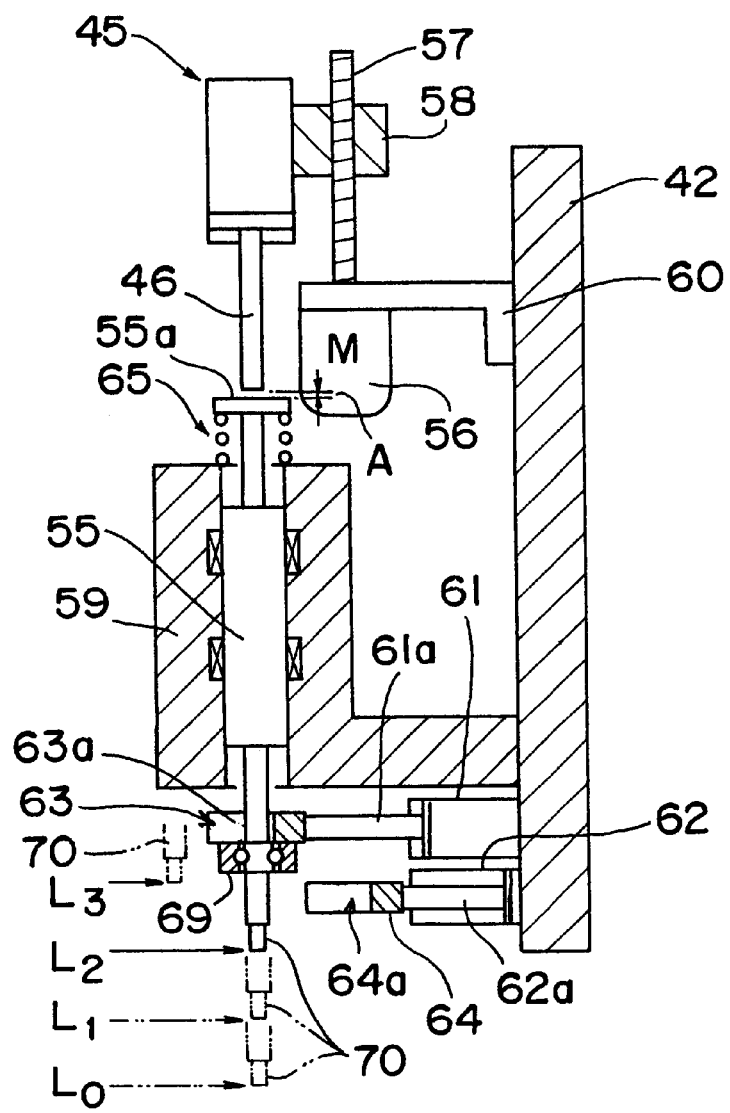
FIG. 5 is a partially sectional view for explaining a component suction nozzle elevating device according to another embodiment of the present invention.

FIG. 5 is a partially sectional view for explaining a component suction nozzle elevating device according to another embodiment of the present invention. The basic constitution is the same as that shown in FIG. 3 and FIGS. 4A to 4C, but a simpler constitution is shown to explain nozzle height switching operations and nozzle switching operations. That is, the lower end of the piston rod 46 of the nozzle selecting cylinder 45 can be brought into contact with a flat plate portion 55a fixed to the upper end portion of the nozzle elevating shaft 55. The flat plate portion 55a is easily brought into contact and easily depressed by the lower end of the piston rod 46.

In FIG. 2, reference numeral 50 denotes a θ rotary drive motor for adjusting attitudes of components sucked by the nozzles 70 by rotating the nozzle elevating shafts 55 about each axis in the θ direction. Reference numeral 52 denotes a gear fixed to the rotating shaft of the θ rotary drive motor 50. Reference numeral 53 denotes a θ rotating gear fixed to the intermediate portion of each nozzle elevating shaft 55. Reference numeral 51 denotes a belt having a double-sided teeth to be engaged to the θ rotating gear 53 of each nozzle elevating shaft 55 and the gear 52 of the θ rotary drive motor 50. Therefore, when the θ rotary drive motor 50 is rotary-driven, the θ rotating gears 53 of all the nozzle elevating shafts 55 are rotated by the belt 51 with the double-sided teeth and the attitudes of the components sucked by the nozzles 70 are adjusted.

A nozzle height switching operation in the component suction nozzle elevating device in FIG. 5 is described in detail below.

FIGS. 6A, 6B, 6C, 6D, 6E, 6F, and 6G are partially sectional views for explaining nozzle height switching operations for the first nozzle 70 of the component suction nozzle elevating device in FIG. 5. FIGS. 7A, 7B, 7C, 7D, 7E, 7F, and 7G are partially sectional views for explaining nozzle height switching operations for the second nozzle of the component suction nozzle elevating device in FIG. 5. The first nozzle 70 and the second nozzle 70 are positioned at level 1 in FIGS. 6A and 7A, but FIGS. 6F and 7F show a state that the positions thereof are changed to level 2.

Figure 7A:
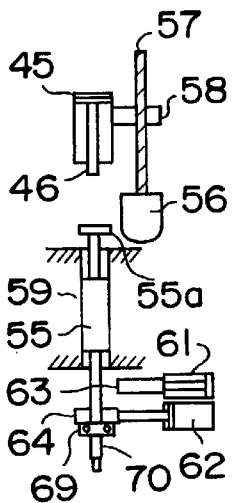
FIGS. 7A, 7B, 7C, 7D, 7E, 7F, and 7G are partially sectional views for explaining operations of switching the nozzle height of a second nozzle of the component suction nozzle elevating device in FIG. 5.

FIGS. 6A and 7A show a state that a previous process is completed. At this time, the elevating member 58 is raised by a drive of the elevation drive motor 56 to a position which is a prescribed height A higher than the current level. At this time, the nozzle elevating shafts 55 are all stopped and no elevating operation is performed. In FIGS. 6A and 7A, the first nozzle 70 is selected, a nozzle selecting cylinder 45-1 corresponding to the first nozzle 70 is turned on and then the piston rod 46 thereof is lowered to the lower end position. On the other hand, since a nozzle selecting cylinder 45-2 corresponding to the second nozzle 70 is off, the piston rod 46 stays at the upper end position.

Figure 7B:
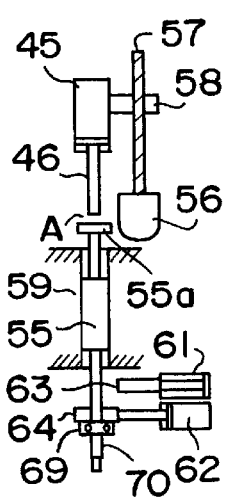

Subsequently, as shown in FIGS. 6B and 7B, all the nozzle selecting cylinders 45 (45-1 to 45-10) are turned on so that all the piston rods 46 are lowered to the respective lower end positions.

Figure 7C:
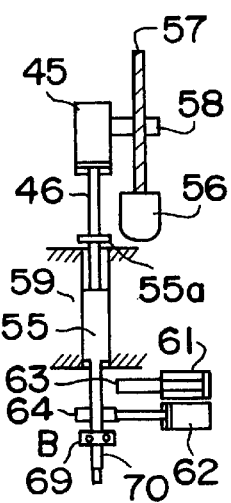
Figure 7D:
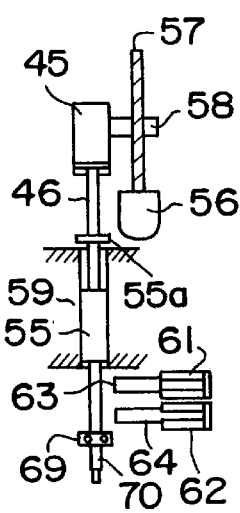
Figure 7E:
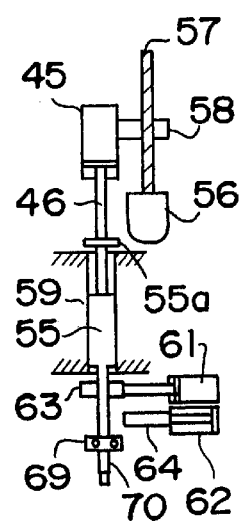
Figure 7F:
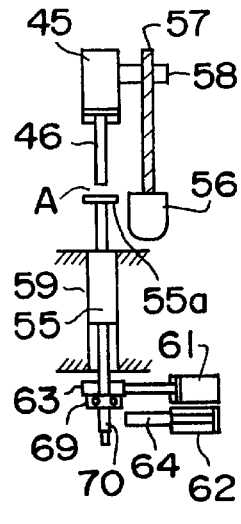

Subsequently, as shown in FIGS. 6C and 7C, the elevating member 58 starts lowering by a drive of the elevation drive motor 56. Then, lower ends of all the piston rods 46 of all nozzle selecting cylinders 45 lowered together with the elevating member 58 are brought into contact with the upper ends of all the nozzle elevating shafts 55 and all the nozzle elevating shafts 55 start lowering. At this time, the elevating member 58 is lowered until all the nozzle elevating shafts 55 are positioned at a height position which is further a prescribed height A lower than a lower level out of the current level and a changed level. That is, for example, in Case 1, the current level is at level 3 which is the highest end position, and is to be changed to level 2 which is the intermediate position. Then, the elevating member 58 is lowered so that all the nozzle elevating shafts 55 are lowered by a height difference ΔH between level 3 and level 2 plus the prescribed height A. In Case 2, the current level is at level 3 which is the highest end position, and is to be changed to level 1 which is the intermediate position. Then, the elevating member 58 is lowered so that all the nozzle elevating shafts 55 are lowered by a height difference ΔH between level 3 and level 1 plus the prescribed height A. In Case 3, the current level is at level 2 which is the intermediate position, and is to be changed to level 1 which is the lowest end position. Then, the elevating member 58 is lowered so that all the nozzle elevating shafts 55 are lowered by a height difference ΔH between level 2 and level 1 plus the prescribed height A. In Case 4 (corresponding to FIGS. 6C and 7C), the current level is at level 1 which is the lowest end position, and is to be changed to level 2 which is the intermediate position. Then, since the current level 1 is lower than level 2, the elevating member 58 is lowered so that all the nozzle elevating shafts 55 are lowered only by the prescribed height A. In Case 5, the current level is at level 1 which is the lowest end position, and is to be changed to level 3 which is the intermediate position. Then, since the current level 1 is lower than level 3, the elevating member 58 is lowered so that all the nozzle elevating shafts 55 are lowered only by the prescribed height A.

Subsequently, as shown in FIGS. 6D, 7D, 6E and 7E, a top dead center level is changed. That is, depending on the level of a top dead center to be changed, the first top dead center level switching cylinder 62 and second top dead center level switching cylinder 61 or either thereof is turned on or off to switch the top dead center level. That is, in the aforementioned Case 1 (level 3→level 2), the first top dead center level switching cylinder 62 is kept off while the second top dead center level switching cylinder 61 is turned on. In the aforementioned Case 2 (level 3→level 1), the second top dead center level switching cylinder 61 is kept off while the first top dead center level switching cylinder 62 is turned on. In the aforementioned Case 3 (level 2→level 1), the second top dead center level switching cylinder 61 is turned off while the first top dead center level switching cylinder 62 is turned on. In the aforementioned Case 4 (level 1→level 2) (corresponding to FIGS. 6C to 6E and FIGS. 7C to 7E), the first top dead center level switching cylinder 62 is turned off while the second top dead center level switching cylinder 61 is turned on. In the aforementioned Case 5 (level 1→level 3), the first top dead center level switching cylinder 62 is turned off while the first top dead center level switching cylinder 62 is kept off.

Subsequently, as shown in FIGS. 6F and 7F, by raising the elevating member 58 by a drive of the elevation drive motor 56, all the nozzle elevating shafts 55 are raised to the above switched top dead center level by an urging force of the spring 65 and the elevating member 58 is further raised to a position of a height obtained by adding the prescribed height A to the top dead center level. As a result, a gap A equal to the prescribed height A is formed between the lower ends of all the piston rods 46 and the upper end portions of all the nozzle elevating shafts 55.

Figure 7G:
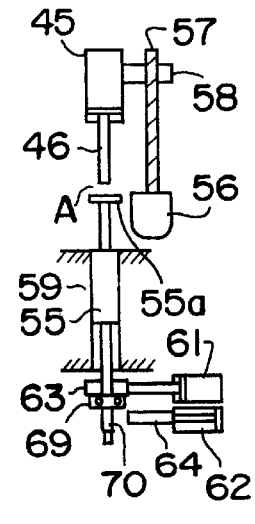

Subsequently, as shown in FIGS. 6G and 7G, all the nozzle selecting cylinders 45 are turned off and all the piston rods 46 are raised to the upper ends thereof. Thus, a series of nozzle height switching operations are finished. It is noted that FIGS. 6G and FIG. 7G show a state that the second nozzle 70 is selected. The nozzle selecting cylinder 45-2 corresponding to the second nozzle 70 is turned on and the piston rod 46 thereof is lowered to the lower end position. On the other hand, since the nozzle selecting cylinder 45-1 corresponding to the first nozzle 70 is off, the piston rod 46 stays at the upper end position.

Described below is a case where one nozzle 70 is selected from the ten nozzles 70 switched to a desired level and component suction and mounting operations thereof are performed.

FIGS. 8A, 8B, 8C, 8D, 8E, and 8F are partially sectional views for explaining nozzle switching operations for the first nozzle of the component suction nozzle elevating device in FIG. 5. FIGS. 9A, 9B, 9C, 9D, 9E, and 9F are partially sectional views for explaining nozzle switching operations for the second nozzle of the component suction nozzle elevating device in FIG. 5. Here, the first nozzle 70 and the second nozzle 70 are positioned at level 2.

FIGS. 8A and 9A show a state that the previous process is completed. Here, the first nozzle 70 is selected. The nozzle selecting cylinder 45-1 corresponding to the first nozzle 70 is turned on and the piston rod 46-1 thereof is lowered to the lower end position while the nozzle selecting cylinder 45-2 corresponding to the second nozzle 70 is off. Therefore, the piston rod 46-2 stays at the upper end.

As shown in FIGS. 8B and 9B, while the nozzle selecting cylinder 45-1 is on, the elevating member 58 start lowering by a drive of the elevation drive motor 56. Subsequently, the lower end of the piston rod 46-1 of the first nozzle selecting cylinder 45-1 lowered together with the elevating member 58 is brought into contact with the upper end of the nozzle elevating shaft 55 of the first nozzle 70 and only this nozzle elevating shaft 55 starts lowering and is lowered to a suction position. Subsequently, the operating head 4, 14 is moved to a desired component supply unit to suck a desired component. Subsequently, the operating head 4, 14 is moved to a recognition position to perform a recognition operation and then the operating head is moved to a board 2 to mount the component at a prescribed mounting position. The lowering operation of the nozzle 70 may be carried out while the operating head 4, 14 is being moved.

Subsequently, as shown in FIGS. 8C and 9C, when the component mounting operation by the first nozzle 70 is finished, the elevating member 58 starts rising by a reverse drive of the elevation drive motor 56. When the depressing force to the upper end of the nozzle elevating shaft 55 of the first nozzle 70 by the lower end of the piston rod 46-1 of the first nozzle selecting cylinder 45-1 is released, the nozzle elevating shaft 55 of the first nozzle 70 starts rising by an urging force of a spring 65. Then, even after the nozzle elevating shaft 55 of the first nozzle 70 is positioned at the upper end position, the elevating member 58 further continues to rise by the reverse drive of the elevation drive motor 56. Then, after raised until a gap (dimension A) is formed between the lower end of the piston rod 46-1 and the upper end portion nozzle elevating shaft 55, the elevating member 58 stops rising.

Subsequently, as shown in FIGS. 8D and 9D, the nozzle is switched. That is, the nozzle selecting cylinder 45-1 corresponding to the first nozzle 70 is turned off from on through switching and the nozzle selecting cylinder 45-2 corresponding to second nozzle 70 to be used next is turned on from off through switching. While the piston rod 46-2 thereof is lowered to the lower end position, the piston rod 46-1 stays at the upper end position since the nozzle selecting cylinder 45-1 corresponding to the first nozzle 70 is turned off.

As shown in FIGS. 8E and 9E, while the second nozzle selecting cylinder 45-2 is on, the elevating member 58 starts lowering by a drive of the elevation drive motor 56. Subsequently, the lower end of the piston rod 46-2 of the second nozzle selecting cylinder 45-2 lowered together with the elevating member 58 is brought into contact with the upper end of the nozzle elevating shaft 55 of the first nozzle 70 and thus, only this nozzle elevating shaft 55 starts lowering and is lowered to a suction position. Subsequently, the operating head 4, 14 is moved to a desired component supply unit to suck a desired component. Subsequently, the operating head 4, 14 is moved to a recognition position to perform a recognition operation and then the operating head is moved to a board 2 to mount the component at a prescribed mounting position. The lowering operation of the nozzle 70 may be carried out while the operating head 4, 14 is being moved.

Subsequently, as shown in FIGS. 8F and 9F, when the component mounting operation by the second nozzle 70 is finished, the elevating member 58 starts rising by a reverse drive of the elevation drive motor 56. When the depressing force to the upper end of the nozzle elevating shaft 55 of the second nozzle 70 by the lower end of the piston rod 46-2 of the second nozzle selecting cylinder 45-2 is released, the nozzle elevating shaft 55 of the second nozzle 70 starts rising by an urging force of the spring 65. Then, even after the nozzle elevating shaft 55 of the second nozzle 70 is positioned at the upper end position, the elevating member 58 further continues to rise by the reverse drive of the elevation drive motor 56. Then, after raised until a gap (dimension A) is formed between the lower end of the piston rod 46-2 and the upper end portion of the nozzle elevating shaft 55, the elevating member 58 stops rising.

Subsequently, the same operation is performed for the following third nozzle 70 and, as required, by continuing this operation until the tenth nozzle 70, components can be mounted by the ten nozzles 70.

Here, in a normal component mounting operation, the mounting operation is started at level 1. After all the applicable components which can be mounted at level 1 are mounted, the operation proceeds to level 2 and level 3 successively (see a flow in FIG. 12 described later). At this time, after the level is switched to level 2 or level 3, the level is not returned to level 1 until mounting of components onto one board is completed. This means that the components are mounted in the order from small components to large components. Here, the small component refers to a component having a small area and a low component height. The large component refers to a component having a large area and a high component height.

The reason for employing such a component mounting order is that the small components are generally required to be mounted with small gaps therebetween, that is, are required to be mounted with narrow adjacent pitches. This is because, if the large components (particularly, those having high component heights) are mounted first, the components need to be mounted while avoiding these large components and the adjacent pitches cannot be made small. QFP or the like is a component which requires a mounting accuracy and has a large area. If such QFPs are mounted first, it is not preferable to mount various components thereafter since a mounting impact is applied to a board and accuracy of components mounted first such as QFPs or the like requiring mounting accuracy can be affected. With the above reasons, basically, small components are mounted first in general.

One of features of the component mounting apparatus according to this embodiment is that, to improve the mounting process time, components having low component heights have a short nozzle rising distance to shorten the vertical movement distance of the nozzle so that the suction time and mounting time can be shortened.

Therefore, components are preferably mounted in the order successively from small components (particularly, those having low component heights). The small components are mounted first according to the general mounting order currently employed as described in the above reasons. Therefore, in the component mounting apparatus according to this embodiment, the nozzle height (rising height when a component is sucked) is switched by a three-stage switching method depending on the component height so that the mounting process time can be improved.

Figure 10:
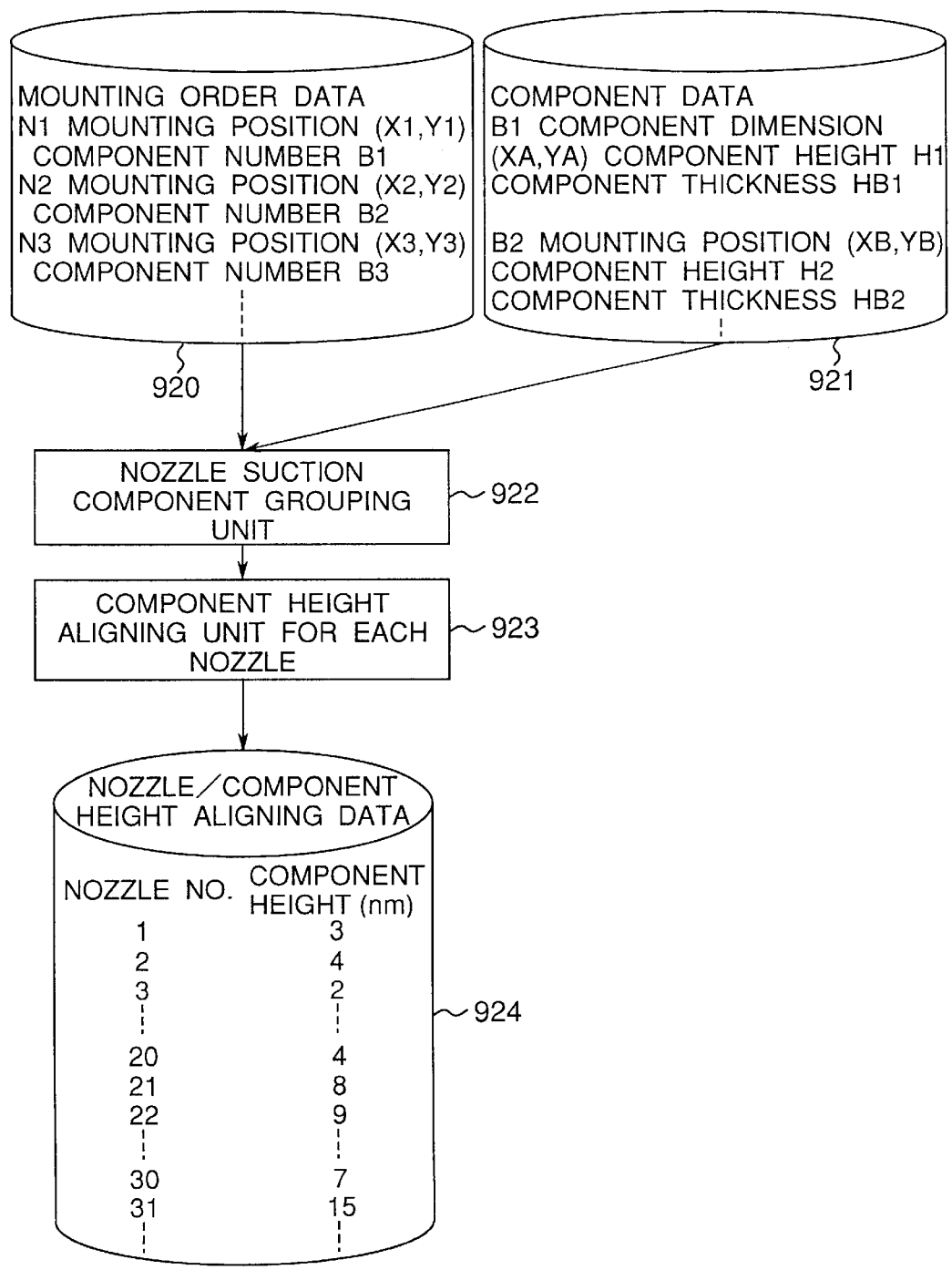
FIG. 10 is a block diagram of a control unit for carrying out one example of the nozzle height switching operations in the component suction nozzle elevating device in FIG. 5.

FIG. 10 is a block diagram showing a control unit for performing an example of a nozzle height switching operation of the component suction nozzle elevating device in FIG. 5. Shown here is a constitution required in the following case. In order to efficiently perform a nozzle height switching operation, components are grouped and height alignment processing is performed in advance based on the height information. Based on a mounting program created as a result thereof, a mounting program for relating the nozzle number and component height information is created. While switching of the height level of the nozzle 70 is judged based on the mounting program, mounting operations are performed. Therefore, the component suction nozzle elevating device is generally provided with a first storage device 920, a second storage device 921, a nozzle suction component grouping unit 922, component height aligning unit 923 for each nozzle, and a nozzle/component height aligning data storage device 924.

The first storage device 920 stores mounting order data of components to be mounted. For example, information of relations between mounting positions in the X-Y coordinate for the mounting order N1, N2, N3, . . . and component numbers of components is stored, such as N1 mounting position (X1, Y1) component number B1, N2 mounting position (X2, Y2) component number B2, and N3 mounting position (X3, Y3) component number B3.

Also, the second storage device 921 stores component data of components to be mounted. For example, component information for a component of component number B1 is stored, such as component dimensions in the X direction and Y direction (XA, YA), component height dimension H1, and component body thickness dimension HB1. Component information for a component of component number B2 is stored, such as component dimensions in the X direction and Y direction (XB, YB), component height dimension H2, and component body thickness dimension HB2.

The nozzle suction component grouping unit 922 performs the following operations. That is, the number of components which can be sucked and held by the operating head 4, 14 depends on the number of the nozzles 70. With the above ten nozzles 70, ten is the maximum number. However, all the nozzles 70 cannot always suck components by depending on the size of components. When components having large component areas are sucked, it may be necessary that a nozzle adjacent to a nozzle sucking the component having large component areas does not suck a component. Therefore, in the above mounting order, a processing for determining the number of components which can be sucked and held by an operating head 4, 14 having the ten nozzles 70 is carried out by the nozzle suction component grouping unit 922.

The component height aligning unit 923 for each nozzle performs grouping of components to be sucked by the nozzles 70 based on the component height dimension information stored in the second storage device 921. That is, for example, when the nozzle height can be changed to the three kinds of levels 1–3 as described above, components are divided into three groups depending on the component height information. For example, divided groups include a first component group of components having a low height, that is, components to be sucked by a nozzle at the level-1 height, a second component group of components having an intermediate height, that is, components to be sucked by a nozzle at the level-2 height, and a third component group of components having a high height, that is, components to be sucked by a nozzle at the level-3 height.

The nozzle/component height aligning data storage device 924 stores information of results of processing by the component height aligning unit 923 for each nozzle. As a result, relations between the number of the nozzles 70 and component heights of components to be mounted are stored.

Figure 11:
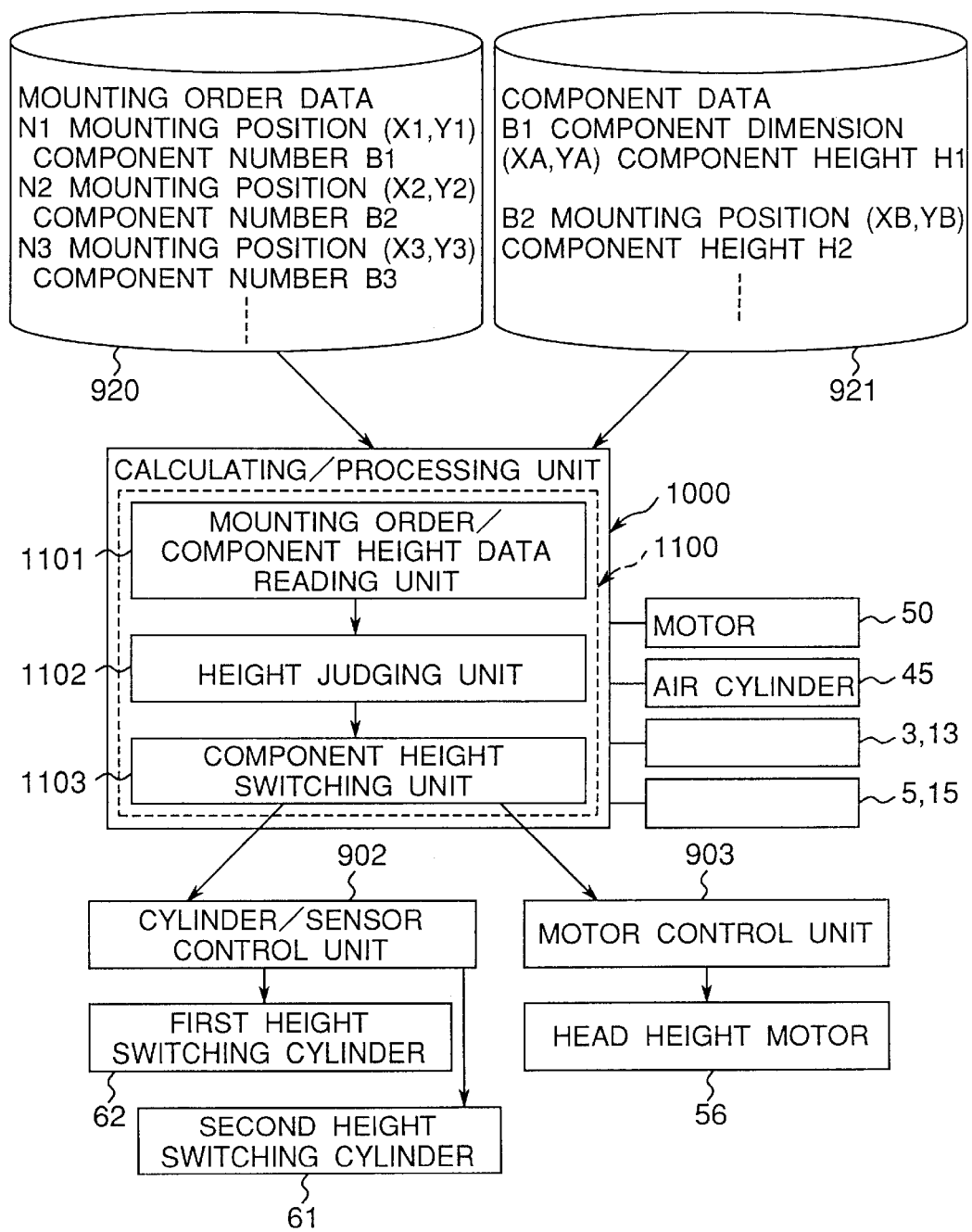
FIG. 11 is a block diagram of a control unit for carrying out another example of the nozzle height switching operations in the component suction nozzle elevating device in FIG. 5.

FIG. 11 is a block diagram of a control unit for performing another example of a nozzle height switching operation by the component suction nozzle elevating device in FIG. 5. In the example in FIG. 10, the mounting program for relating the nozzle number and the height information of the components is created in advance. In this example, based on the mounting order data of components to be mounted in the first storage device 920 and the component data of components to be mounted in the second storage device 921, the relation with the nozzle height level is judged by the height of each component to switch the level in a calculating/processing unit 1100 in a control device 1000 for controlling operations of the whole mounting apparatus.

Therefore, the calculating/processing unit 1100 of the mounting apparatus is generally constituted by a mounting order/component height data reading unit 1101, a height judging unit 1102, and a component height switching unit 1103.

The mounting order/component height data reading unit 1101 reads the mounting order data and the component data.

Subsequently, in the height judging unit 1102, the relation with the nozzle height level is judged by the height of each component. For example, as described above, the nozzle 70 is switched at three stages of levels 1–3. Assuming that level 1 is applied to a component lower than a first threshold TH1, level 2 is applied to a component equal to the first threshold TH1 or higher and lower than a second threshold TH2, and level 3 is applied to a component equal to the second threshold TH2 or higher, which of the three stages of levels 1–3 is to be applied is judged by the height of each component. As an example of the first threshold TH1, 6 mm can be employed. As an example of the second threshold TH2, 13 mm can be employed. However, the first and second thresholds are not limited to these, but arbitrary values can be appropriately set under a condition of TH1<TH2.

Subsequently, the component height switching unit 1103 compares a nozzle level to be applied to components to be sucked next and the current level, and judges how switching operations of the nozzle height are performed so that a cylinder-sensor control unit 902 and a motor control unit 903 control driving of the elevation drive motor 56, the nozzle selecting cylinder 45, the first top dead center level switching cylinder (first height switching cylinder) 62, second top dead center level switching cylinder (second height switching cylinder) 61, and so forth.

Figure 12:
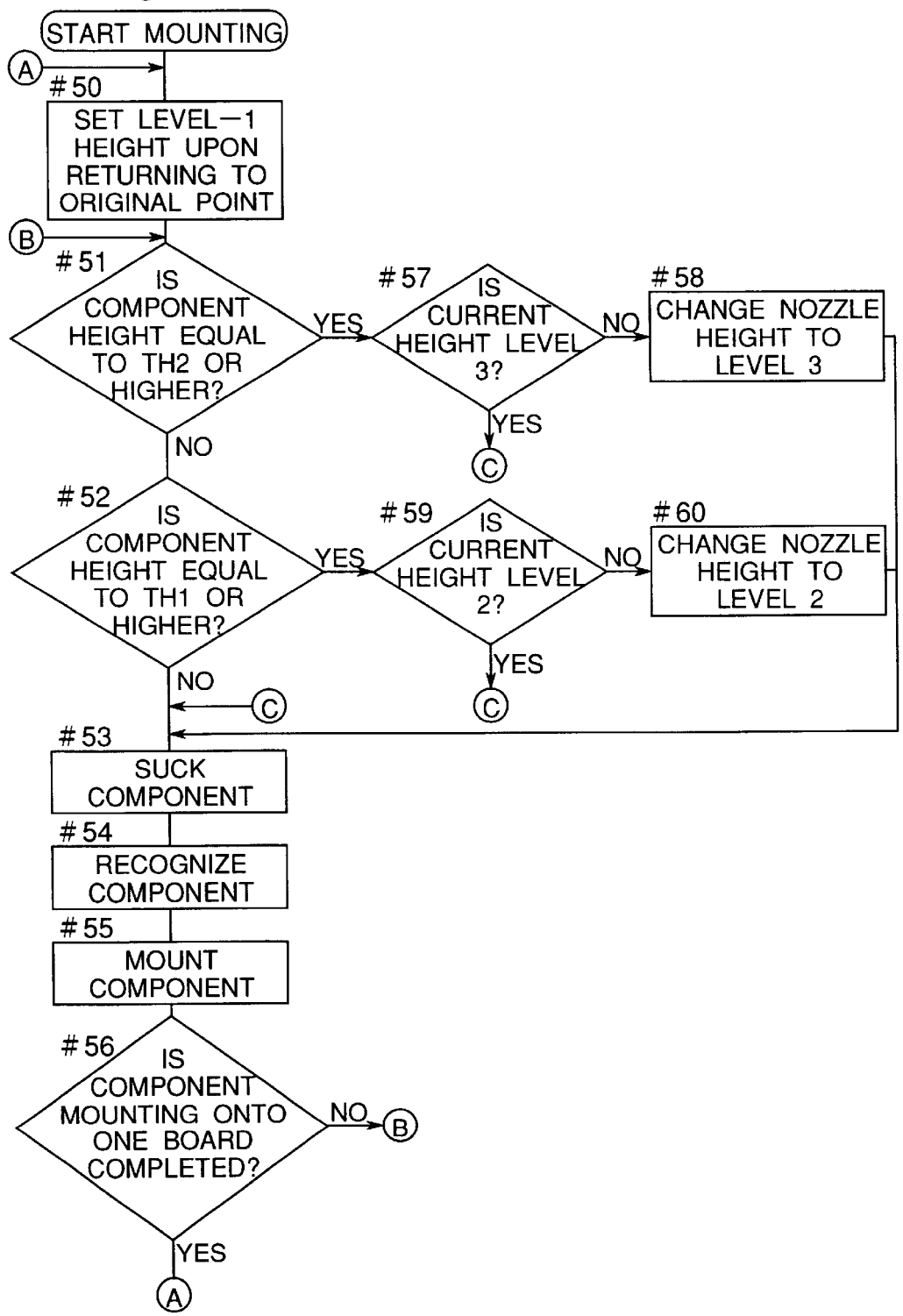
FIG. 12 is a flowchart of one example of the nozzle height switching operation in the component suction nozzle elevating device is FIG. 5.

Described below is an operation of judging which of the three stages of the levels 1–3 of the nozzles 70 is applied depending on the height of each component. FIG. 12 is a flowchart of this judging operation, that is, a nozzle height switching operation of the component suction nozzle elevating device in FIG. 5.

First, mounting is started. In Step #50, when the nozzles 70 are returned to the original point, the height at level 1 is set.

Subsequently, in Step #51, whether the component height is equal to the second threshold TH2 or higher is judged. If the component height is lower than the second threshold TH2, the operation proceeds to Step #52. If the component height is equal to the second threshold TH2 or higher, the operation proceeds to Step #57.

In Step #52, whether the component height is equal to the first threshold TH1 or higher is judged. If the component height is lower than the first threshold TH1, the nozzle at level 1 can be applied. Therefore, switching of the nozzle height is unnecessary and the operation proceeds to Step #53. On the other hand, if the component height is equal to the first threshold TH1 or higher, the operation proceeds to Step #59.

In Step #53, components are sucked by the nozzles 70. In Step #54, components sucked by the nozzles 70 are recognized. In Step #55, components sucked by the nozzles 70 are mounted.

Subsequently, in Step #56, whether mounting of components onto one board is completed, that is, whether any component to be mounted remains is judged. If there remains no component to be mounted, completion of mounting of components onto the one board is determined and the operation returns to Step #50. Or, in some cases, a series of these operations may be finished. On the other hand, if there remains any component to be mounted, the operation returns to Step #51 and the above operations are repeated.

Meanwhile, in Step #57, whether the current level is level 3 is judged. When the current level is level 3, the level does not need to be switched. Therefore, the operation proceeds to Step #53 and a component is mounted by a nozzle at level 3. On the other hand, since the level needs to be switched when the current level is not level 3, the operation proceeds to Step #58.

In Step #58, the nozzle height is changed from the current level to level 3. Then, the operation proceeds to Step #53 and a component is mounted by a nozzle at level 3.

In Step #59, whether the current level is level 2 is judged. When the current level is level 2, the level does not need to be switched. Therefore, the operation proceeds to Step #53 and a component is mounted by a nozzle at level 2. On the other hand, since the level needs to be switched when the current level is not level 2, the operation proceeds to Step #60.

In Step #60, the nozzle height is changed from the current level to level 2. Then, the operation proceeds to Step #53 and a component is mounted by a nozzle at level 2.

Thus, the nozzle height switching operation is carried out. It is noted that, in this nozzle height switching operation, when the height is once switched from level 1 to level 2 or 3, the height cannot be returned to level 1 as described above. This is because, as described above, this is suitable to a case where a mounting program relating the nozzle number and the component height information is created in FIG. 10 and then switching of the nozzle level is judged based on the mounting program.

For example, in information in the nozzle/component height aligning data storage device 924 in FIG. 10, when switching of the level is judged according to the flow in FIG. 12 in a state that 6 mm is employed as an example of the first threshold TH1 and 13 mm is employed as an example of the second threshold TH2, the component height is 3 mm for the nozzle 70 of No. 1, the component height is 4 mm for the nozzle 70 of No. 2, component height is 2 mm for the nozzle 70 of No. 3, . . . , and the component height is 4 mm for the nozzle 70 of No. 20. Therefore, mounting operations are performed by the nozzles of Nos. 1–No. 20 at the height of level 1. Since the component height is 8 mm for the nozzle 70 of No. 21, the component height is 9 mm for the nozzle 70 of No. 22, . . . , and the component height is 7 mm for the nozzle 70 of No. 30, mounting operations are performed by the nozzles of Nos. 21–30 at the height of level 2. Since the component height is 15 mm for the nozzle of 70 of No. 31, . . . , mounting operations are performed by the nozzle of Nos. 31 and later at the height of level 3. Here, it is assumed that components are mounted by the nozzles of Nos. 1–10 in the first mounting operation by the operating head, components are mounted by the nozzles of Nos. 11–20 in the second mounting operation by the operating head, and components are mounted by the nozzles of Nos. 21–30 in the third mounting operation by the operating head. However, nozzles actually used, for example, the nozzles of Nos. 1, 11, and 21 are the same, that is, the first nozzle 70.

Figure 13:
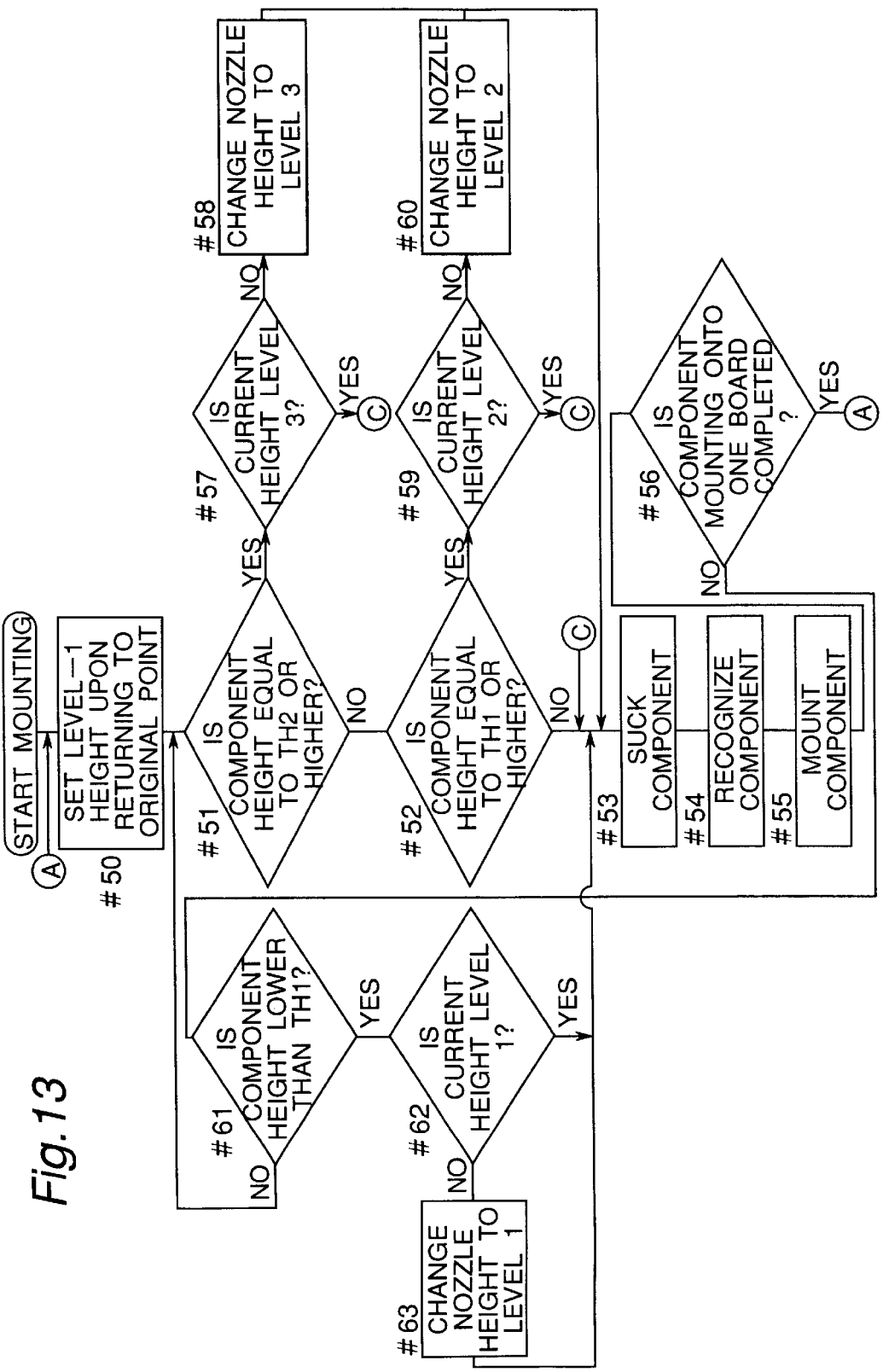
FIG. 13 is a flowchart of another example of the nozzle height switching operations in the component suction nozzle elevating device is FIG. 5.
Figure 14:
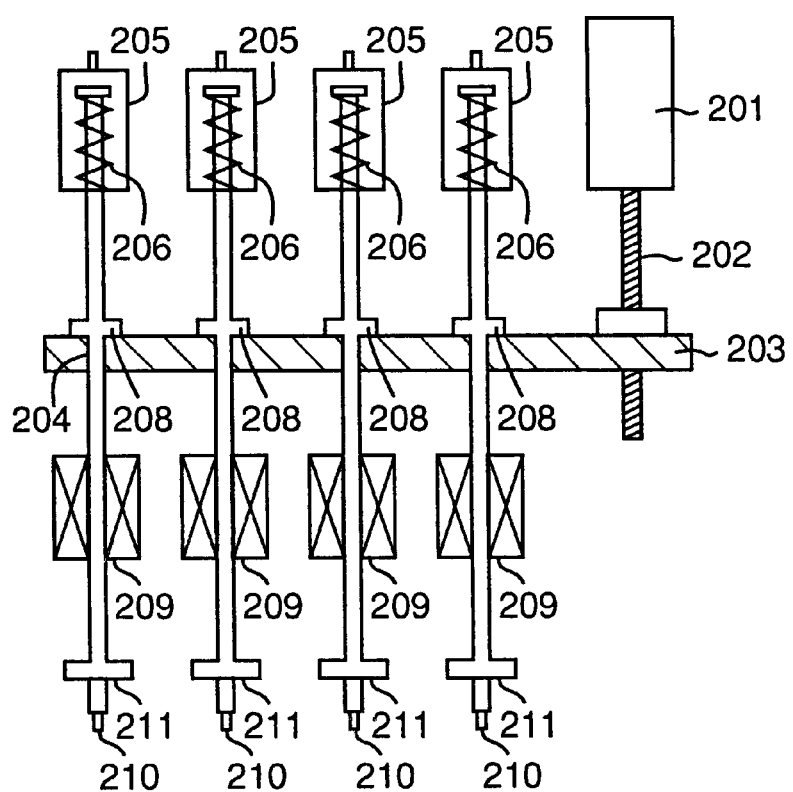
FIG. 14 is a schematic partially sectional view of a conventional component suction nozzle elevating device at an original point state.
Figure 15:
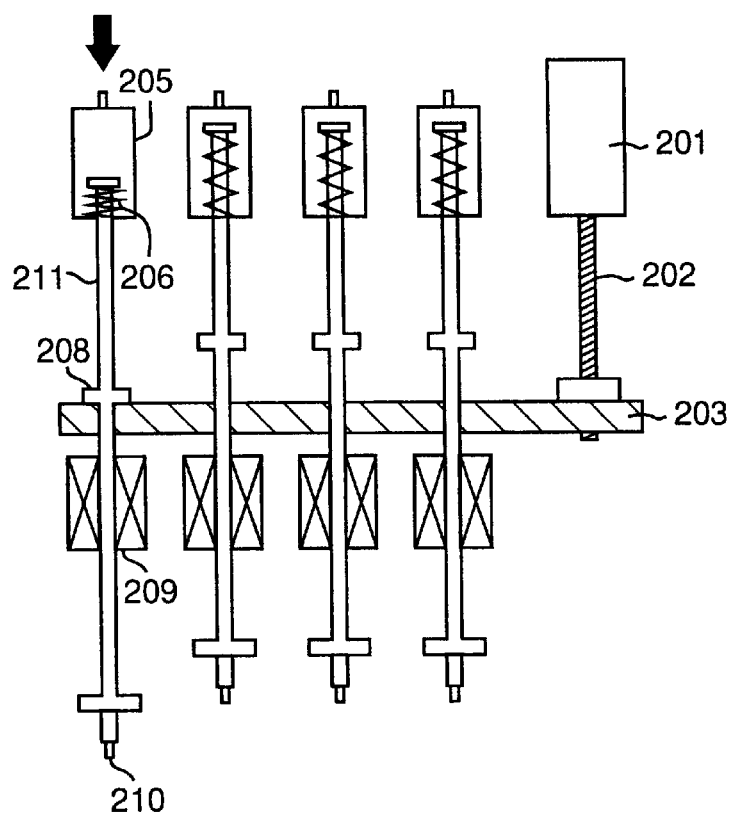
FIG. 15 is a schematic partially sectional view of a state where one nozzle is selected in the conventional component suction nozzle elevating device in FIG. 14.
Figure 16:
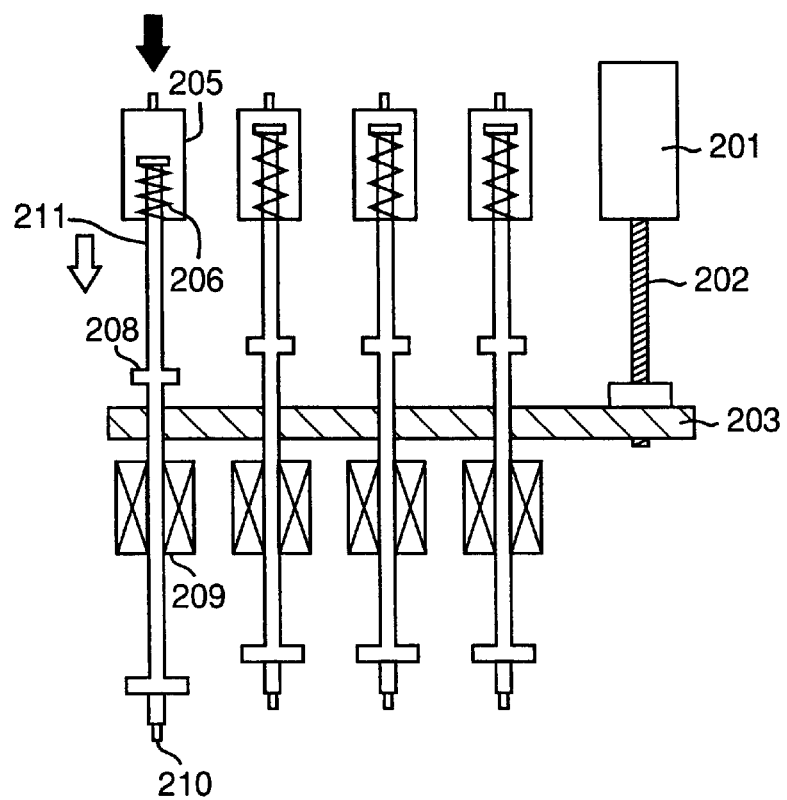
FIG. 16 is a schematic partially sectional view of a state where one nozzle is selected and a cylinder drive is delayed in the conventional component suction nozzle elevating device in FIG. 14.
Figure 17:
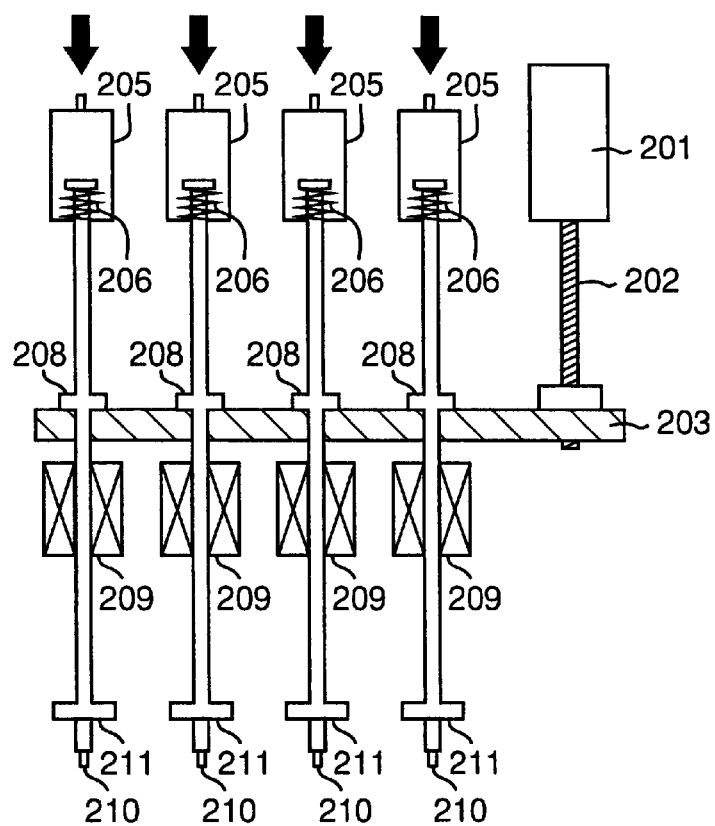
FIG. 17 is a schematic partially sectional view of a state where all nozzles are selected and a motor is overloaded in the conventional component suction nozzle elevating device in FIG. 14.

On the other hand, FIG. 13 is a flowchart according to a modification of the nozzle height switching operation of the component suction nozzle elevating device in FIG. 5. This is basically the same as FIG. 12, but component mounting is carried out once at level 1 and then, even after the height is once switched to level 2 or 3, the height can be switched to level 1 by judging after Step #56 whether level 1 is applied. Therefore, this flow can be applied not only to the constitution of FIG. 10, but also that of FIG. 11.

That is, in Step #61, whether the component height is lower than the first threshold TH1 is judged. When the component height is not lower than the first threshold TH1, the operation proceeds to Step #51. On the other hand, when the component height is lower than the first threshold TH1, the operation proceeds to Step #62.

In Step #62, whether the current level is level 1 is judged. When the current level is level 1, the level does not need to be switched. Therefore, the operation proceeds to Step #53 and a component is mounted by a nozzle at level 1. On the other hand, since the level needs to be switched when the current level is not level 1, the operation proceeds to Step #63.

In Step #63, the nozzle height is changed from the current level to level 1. Then, the operation proceeds to Step #53 and a component is mounted by a nozzle at level 1.

In some cases, instead of Step #50, Step #61 may be performed so that whether level 1 can be applied is judged before application to level 3 or 2 is judged for each component.

According to the above embodiment, when a nozzle is selected, a gap is unfailingly formed between the upper end of the nozzle elevating shaft 55 and the piston rod 46 of the nozzle selecting cylinder 45 positioned at the lower end position so that, at the time of nozzle selecting, the piston rod 46 of the nozzle selecting cylinder 45 is not brought into contact with the nozzle elevating shaft 55 and that the piston rod 46 is brought into contact with the nozzle elevating shaft 55 only when the elevating member 58 is lowered by a drive of the elevation drive motor 56. Thus, since the piston rod 46 is not brought into contact with the nozzle elevating shaft 55, no impact is generated to the nozzle elevating shaft and a component sucked by the nozzle is not displaced or dropped.

When all the nozzle elevating shafts 55 are raised, all the nozzle selecting cylinders 45 are raised by a drive of the elevation drive motor 56 and the nozzle elevating shafts are raised by urging forces. Therefore, unlike a conventional one, all the nozzle elevating shafts do not need to be raised by the motor via the elevating plate by overcoming an activating force of the air cylinder. Thus, the motor is not overloaded.

Furthermore, by switching the nozzle height depending on the component height as a method of switching nozzle height (rising height when a component is sucked) in three stages, a component having a low component height has a short nozzle rising distance and the vertical movement distance of the nozzle is shortened so that suction time and mounting time can be shortened. Thus, the mounting process time can be improved.

Furthermore, in the embodiment in FIGS. 2 to 4, since the lower end of the piston rod 46 of the nozzle selecting cylinder 45 is lowered until brought into contact with the edge of the notch 58a of the elevating member 58, the lower end position of the piston rod 46 is consistent at all times and does not vary. As a result, the position at which the lower end of the piston rod 46 is brought into contact with the upper end of the nozzle elevating shaft 55 becomes consistent and the elevating amount of nozzle elevating shaft 55 can be more precisely controlled. Therefore, components can be mounted without being overloaded.

It is noted that the present invention is not limited to the above embodiment, but can be applied in other various aspects.

For example, instead of lowering the piston rod 46 of the nozzle selecting cylinder 45 towards the upper end portion of the selected nozzle elevating shaft in a range in which the piston rod 46 is not brought into contact with the selected nozzle elevating shaft 55, the piston rod 46 of the nozzle selecting cylinder 45 may be fixed to the elevating member side and be lowered towards the upper end portion of the nozzle elevating shaft 55 in a range that the main body of the nozzle selecting cylinder 45 is not brought into contact with the nozzle elevating shaft 55.

Furthermore, the ball screw shaft 57 is used as an example of a screw shaft linked to the rotating shaft of the rotary elevation drive device, but the screw shaft is not limited to this and may be a normal screw shaft.

According to the present invention, when a nozzle is selected, a gap is unfailingly formed between the upper end of the nozzle elevating shaft and the piston rod of the nozzle selecting cylinder positioned at the lower end position so that, at the time of nozzle selecting, the piston rod of the nozzle selecting cylinder is not brought into contact with the nozzle elevating shaft and that the cylinder selectively lowered from the nozzle selecting actuator is brought into contact with the selected nozzle elevating shaft only when the piston rod is lowered by a drive of the elevation drive motor and all the nozzle selecting actuators are simultaneously lowered. Thus, since the piston rod is not brought into contact with the nozzle elevating shaft at selecting the nozzle, no impact is generated to the nozzle elevation shaft and a component sucked by the nozzle is not displaced or dropped.

When all the nozzle elevating shafts are raised, all the nozzle selecting cylinders are simultaneously raised by the drive of the elevation drive motor and the nozzle elevating shafts are raised by urging forces. Therefore, unlike a conventional one, all the nozzle elevating shafts do not need to be raised by the motor via the elevating plate by overcoming an activating force of the air cylinder. Thus, the motor is not overloaded.

By switching the nozzle height depending on the component height as a method of switching nozzle height (rising height when a component is sucked) in a plurality of stages, a component having a low component height has a short nozzle rising distance and the vertical movement distance of the nozzle is shortened so that suction time and mounting time can be shortened. Thus, the mounting process time can be improved.

When the lower end of the piston rod of the nozzle selecting cylinder is lowered until brought into contact with an edge of the through hole or notch of the elevating member, the lower end position of the piston rod is consistent at all times and does not vary. As a result, the position at which the lower end of the piston rod is brought into contact with the upper end of the nozzle elevating shaft becomes consistent and the amount of elevation of the nozzle elevating shaft can be more precisely controlled. Therefore, a component can be mounted without being overloaded at the time of mounting.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A component suction nozzle elevating device comprising:
    a plurality of nozzle elevating shafts supporting a suction nozzle for sucking and holding components at respective lower ends thereof with the nozzles normally urged upward;
    a plurality of nozzle selecting actuators which are disposed corresponding to the plurality of nozzle elevating shafts and, when one suction nozzle to be lowered is selected from the plurality of nozzles, lowers a cylinder corresponding to the selected nozzle elevating shaft having the selected suction nozzle towards the nozzle elevating shaft in a range where the cylinder is not brought into contact with the selected nozzle elevating shaft;
    a rotary drive device for elevation which simultaneously lowers all the nozzle selecting actuators to bring the cylinder selectively lowered by the nozzle selecting actuator into contact with the selected nozzle elevating shaft in order to lower the nozzle elevating shaft; and
    a top dead center changing device which changes a position of a top dead center of each of the nozzle elevating shafts.

2. A component suction nozzle elevating device according to claim 1, further comprising an elevating member to which all the nozzle selecting actuators are fixed and which is screw-thread to a screw shaft connected to a rotating shaft of the rotary drive device for elevation and raised or lowered by forward and reverse rotation of the screw shaft, wherein the elevating member is raised or lowered by the forward and reverse rotation of the screw shaft so that all the nozzle selecting actuators are simultaneously raised or lowered.

3. A component suction nozzle elevating device according to claim 2, wherein
    the elevating member has a through hole or notch through which an upper end portion of the nozzle elevating shaft can penetrate; when one suction nozzle to be lowered is selected from the plurality of nozzles, the upper end portion of the nozzle elevating shaft is positioned in the through hole or notch in a range in which the upper end portion of the nozzle elevating shaft is not projected above the through hole or notch and a lower end of the cylinder of the nozzle selecting actuator is lowered until brought into contact with an edge of the through hole or notch; a gap is formed between the lower end of the cylinder and the upper end portion of the nozzle elevating shaft in the through hole or notch; and, when the elevating member is lowered by a rotary drive of the rotary drive device for elevation, the lower end of the cylinder and the upper end portion of the nozzle elevating shaft are brought into contact with each other so that the nozzle elevating shaft for elevating is lowered by the lower end of the cylinder.

4. A component suction nozzle elevating device according to claim 2, wherein a flat plate portion with which the lower end of the cylinder is brought into contact and which can be depressed is fixed to the upper end portion of the nozzle elevating shaft; when one suction nozzle to be lowered is selected from the plurality of nozzles and the lower end of the cylinder is lowered, a gap is formed between the lower end of the cylinder and the flat plate portion of the upper end portion of the nozzle elevating shaft; and, when the elevating member is lowered by the rotary drive of the rotary drive device for elevation, the lower end of the cylinder and the flat plate portion of the upper end portion of the nozzle elevating shaft are brought into contact with each other and the nozzle elevating shaft is lowered by the lower end of the cylinder.

5. A component suction nozzle elevating device according to claim 1, wherein the top dead center changing device is constituted by a top dead center changing cylinder having an engaging portion engaged to the nozzle elevating shaft on a piston rod; and the top dead center of the nozzle elevating shaft when the engaging portion of the piston rod is engaged to the nozzle elevating shaft by driving the top dead center changing cylinder is positioned below the top dead center of the nozzle elevating shaft when the engaging portion of the piston rod of the top dead center changing cylinder is unengaged to the nozzle elevating shaft.

6. A component suction nozzle elevating device according to claim 1, wherein the top dead center changing device is constituted by a first top dead center changing actuator and a second top dead center changing actuator and has engaging portions engaged to the nozzle elevating shafts on the piston rods of the respective top dead center changing actuators; and a top dead center of the nozzle elevating shaft is positioned downward in an order of a top dead center of the nozzle elevating shaft when the engaging portion of the piston rod of the first top dead center changing actuator is unengaged to the nozzle elevating shaft, a top dead center of the nozzle elevating shaft when the engaging portion of the piston rod of the first top dead center changing actuator is engaged to the nozzle elevating shaft, and a top dead center of the nozzle elevating shaft when the engaging portion of the piston rod of the second top dead center changing actuator is engaged to the nozzle elevating shaft.

7. A component suction nozzle elevating device according to claim 1, wherein
    the nozzle selecting actuator is a nozzle selecting cylinder; the rotary drive device for elevation is an elevation drive motor; and the screw shaft is a ball screw shaft.

8. A component mounting apparatus comprising:
    component supply units for housing components sucked by the suction nozzles of the component suction nozzle elevating device;
    a head drive device for moving a head having the component suction nozzle elevating device according to claim 1; and
    a board conveying/holding device for holding a board on which components picked up by the suction nozzle of the component suction nozzle elevating device are mounted; the component mounting apparatus, wherein the head is moved to the component supply unit by a drive of the head drive device and one selected suction nozzle is lowered so that a component is picked up by the component suction nozzle elevating device from the component supply unit; the head is moved from the component supply unit to the board by the drive of the head drive device; and the suction nozzle which is selected and picks up the component is lowered by the component suction nozzle elevating device to mount the component onto the board.

9. A component suction nozzle elevating device according to claim 2, wherein the top dead center changing device is constituted by a top dead center changing cylinder having an engaging portion engaged to the nozzle elevating shaft on a piston rod; and the top dead center of the nozzle elevating shaft when the engaging portion of the piston rod is engaged to the nozzle elevating shaft by driving the top dead center changing cylinder is positioned below the top dead center of the nozzle elevating shaft when the engaging portion of the piston rod of the top dead center changing cylinder is unengaged to the nozzle elevating shaft.

10. A component suction nozzle elevating device according to claim 3, wherein the top dead center changing device is constituted by a top dead center changing cylinder having an engaging portion engaged to the nozzle elevating shaft on a piston rod; and the top dead center of the nozzle elevating shaft when the engaging portion of the piston rod is engaged to the nozzle elevating shaft by driving the top dead center changing cylinder is positioned below the top dead center of the nozzle elevating shaft when the engaging portion of the piston rod of the top dead center changing cylinder is unengaged to the nozzle elevating shaft.

11. A component suction nozzle elevating device according to claim 4, wherein the top dead center changing device is constituted by a top dead center changing cylinder having an engaging portion engaged to the nozzle elevating shaft on a piston rod; and the top dead center of the nozzle elevating shaft when the engaging portion of the piston rod is engaged to the nozzle elevating shaft by driving the top dead center changing cylinder is positioned below the top dead center of the nozzle elevating shaft when the engaging portion of the piston rod of the top dead center changing cylinder is unengaged to the nozzle elevating shaft.

12. A component suction nozzle elevating device according to claim 2, wherein the top dead center changing device is constituted by a first top dead center changing actuator and a second top dead center changing actuator and has engaging portions engaged to the nozzle elevating shafts on the piston rods of the respective top dead center changing actuators; and a top dead center of the nozzle elevating shaft is positioned downward in an order of a top dead center of the nozzle elevating shaft when the engaging portion of the piston rod of the first top dead center changing actuator is unengaged to the nozzle elevating shaft, a top dead center of the nozzle elevating shaft when the engaging portion of the piston rod of the first top dead center changing actuator is engaged to the nozzle elevating shaft, and a top dead center of the nozzle elevating shaft when the engaging portion of the piston rod of the second top dead center changing actuator is engaged to the nozzle elevating shaft.

13. A component suction nozzle elevating device according to claim 3, wherein the top dead center changing device is constituted by a first top dead center changing actuator and a second top dead center changing actuator and has engaging portions engaged to the nozzle elevating shafts on the piston rods of the respective top dead center changing actuators; and a top dead center of the nozzle elevating shaft is positioned downward in an order of a top dead center of the nozzle elevating shaft when the engaging portion of the piston rod of the first top dead center changing actuator is unengaged to the nozzle elevating shaft, a top dead center of the nozzle elevating shaft when the engaging portion of the piston rod of the first top dead center changing actuator is engaged to the nozzle elevating shaft, and a top dead center of the nozzle elevating shaft when the engaging portion of the piston rod of the second top dead center changing actuator is engaged to the nozzle elevating shaft.

14. A component suction nozzle elevating device according to claim 4, wherein the top dead center changing device is constituted by a first top dead center changing actuator and a second top dead center changing actuator and has engaging portions engaged to the nozzle elevating shafts on the piston rods of the respective top dead center changing actuators; and a top dead center of the nozzle elevating shaft is positioned downward in an order of a top dead center of the nozzle elevating shaft when the engaging portion of the piston rod of the first top dead center changing actuator is unengaged to the nozzle elevating shaft, a top dead center of the nozzle elevating shaft when the engaging portion of the piston rod of the first top dead center changing actuator is engaged to the nozzle elevating shaft, and a top dead center of the nozzle elevating shaft when the engaging portion of the piston rod of the second top dead center changing actuator is engaged to the nozzle elevating shaft.

15. A component suction nozzle elevating device according to claim 2, wherein
   the nozzle selecting actuator is a nozzle selecting cylinder; the rotary drive device for elevation is an elevation drive motor; and the screw shaft is a ball screw shaft.

16. A component suction nozzle elevating device according to claim 3, wherein
   the nozzle selecting actuator is a nozzle selecting cylinder; the rotary drive device for elevation is an elevation drive motor; and the screw shaft is a ball screw shaft.

17. A component suction nozzle elevating device according to claim 4, wherein
   the nozzle selecting actuator is a nozzle selecting cylinder; the rotary drive device for elevation is an elevation drive motor; and the screw shaft is a ball screw shaft.

18. A component mounting apparatus comprising:
   component supply units for housing components sucked by the suction nozzles of the component suction nozzle elevating device;
   a head drive device for moving a head having the component suction nozzle elevating device according to claim 2; and
   a board conveying/holding device for holding a board on which components picked up by the suction nozzle of the component suction nozzle elevating device are mounted; the component mounting apparatus, wherein the head is moved to the component supply unit by a drive of the head drive device and one selected suction nozzle is lowered so that a component is picked up by the component suction nozzle elevating device from the component supply unit; the head is moved from the component supply unit to the board by the drive of the head drive device; and the suction nozzle which is selected and picks up the component is lowered by the component suction nozzle elevating device to mount the component onto the board.

19. A component mounting apparatus comprising:
   component supply units for housing components sucked by the suction nozzles of the component suction nozzle elevating device;

a head drive device for moving a head having the component suction nozzle elevating device according to claim 3; and a board conveying/holding device for holding a board on which components picked up by the suction nozzle of the component suction nozzle elevating device are mounted; the component mounting apparatus, wherein the head is moved to the component supply unit by a drive of the head drive device and one selected suction nozzle is lowered so that a component is picked up by the component suction nozzle elevating device from the component supply unit; the head is moved from the component supply unit to the board by the drive of the head drive device; and the suction nozzle which is selected and picks up the component is lowered by the component suction nozzle elevating device to mount the component onto the board.

20. A component mounting apparatus comprising:

component supply units for housing components sucked by the suction nozzles of the component suction nozzle elevating device;

a head drive device for moving a head having the component suction nozzle elevating device according to claim 4; and a board conveying/holding device for holding a board on which components picked up by the suction nozzle of the component suction nozzle elevating device are mounted; the component mounting apparatus, wherein:

the head is moved to the component supply unit by a drive of the head drive device and one selected suction nozzle is lowered so that a component is picked up by the component suction nozzle elevating device from the component supply unit; the head is moved from the component supply unit to the board by the drive of the head drive device; and the suction nozzle which is selected and picks up the component is lowered by the component suction nozzle elevating device to mount the component onto the board.

* * * * *

UNITED STATES PATENT AND TRADEMARK OFFICE
CERTIFICATE OF CORRECTION

PATENT NO. : 6,688,833 B1
DATED : February 10, 2004
INVENTOR(S) : Akira Kabeshita et al.

It is certified that error appears in the above-identified patent and that said Letters Patent is hereby corrected as shown below:

Column 24,
Line 8, please replace "wherein:" with -- wherein --.

Signed and Sealed this

Twentieth Day of July, 2004

JON W. DUDAS
*Acting Director of the United States Patent and Trademark Office*